(12) United States Patent
Park

(10) Patent No.: US 9,196,377 B1
(45) Date of Patent: Nov. 24, 2015

(54) ANTI-FUSE TYPE ONE-TIME PROGRAMMABLE MEMORY CELL AND ANTI-FUSE TYPE ONE-TIME PROGRAMMABLE MEMORY CELL ARRAYS

(71) Applicant: SK hynix Inc., Gyeonggi-do (KR)

(72) Inventor: Sung Kun Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/572,127

(22) Filed: Dec. 16, 2014

(30) Foreign Application Priority Data

Sep. 16, 2014 (KR) .......................... 10-2014-0122624

(51) Int. Cl.
*G11C 17/18* (2006.01)
*G11C 17/16* (2006.01)
*G11C 13/00* (2006.01)

(52) U.S. Cl.
CPC ............ *G11C 17/16* (2013.01); *G11C 13/0004* (2013.01); *G11C 17/18* (2013.01); *G11C 2213/71* (2013.01); *G11C 2213/72* (2013.01)

(58) Field of Classification Search
CPC ...... G11C 17/16; G11C 17/18; G11C 13/004; G11C 2213/71; G11C 2213/72
USPC .............................. 365/51, 63, 96, 105, 225.7
See application file for complete search history.

(56) References Cited

U.S. PATENT DOCUMENTS

| | | | | |
|---|---|---|---|---|
| 6,549,447 | B1 * | 4/2003 | Fricke | G11C 3/0004 257/E27.004 |
| 6,707,698 | B2 * | 3/2004 | Fricke | G11C 3/0004 257/E27.004 |
| 8,829,646 | B2 * | 9/2014 | Lung | H01L 27/101 257/5 |

FOREIGN PATENT DOCUMENTS

| | | |
|---|---|---|
| KR | 1020070010077 | 1/2007 |
| KR | 1020110014581 | 2/2011 |

\* cited by examiner

*Primary Examiner* — Gene Auduong
(74) *Attorney, Agent, or Firm* — IP & T Group LLP

(57) ABSTRACT

An anti-fuse type OTP memory cell includes a first active region having a first program region with a first width and a first selection region with a second width that is greater than the first width, a second active region spaced apart from the first active region and having a second program region with a third width and a second selection region with a fourth width that is greater than the third width, a program gate intersecting the first program region and the second program region, a first selection gate intersecting the first selection region, and a second selection gate intersecting the second selection region.

19 Claims, 21 Drawing Sheets

ANTI-FUSE TYPE ONE-TIME PROGRAMMABLE MEMORY CELL AND ANTI-FUSE TYPE ONE-TIME PROGRAMMABLE MEMORY CELL ARRAYS

CROSS-REFERENCE TO RELATED APPLICATION

The present application claims priority under 35 U.S.C 119(a) to Korean Application No. 10-2014-0122624, filed on Sep. 16, 2014, which is incorporated herein by reference in its entirety.

BACKGROUND

1. Technical Field

Various embodiments of the present disclosure relate to nonvolatile memory devices and, more particularly, to anti-fuse type one-time programmable (OTP) memory cells and anti-fuse type OTP memory cell arrays.

2. Related Art

Nonvolatile memory devices retain their stored data even when their power supplies are blocked. Such nonvolatile memory devices may include read only memory (ROM) devices, OTP memory devices and rewritable memory devices. Generally, the nonvolatilememory devices are realized by using a complementary metal-oxide-semiconductor (CMOS) compatible process.

The OTP memory devices may be categorized as either fuse type OTP memory devices or anti-fuse type OTP memory devices. Each of memory cells included in the fuse type OTP memory devices may provide a short circuit before it is programmed and may provide an open circuit after it is programmed. In contrast, each of memory cells included in the anti-fuse type OTP memory devices may provide an open circuit before it is programmed and may provide a short circuit after it is programmed. In consideration of the characteristics of MOS transistors, the CMOS processes may be suitable for fabrication of the anti-fuse type OTP memory devices.

SUMMARY

Various embodiments are directed to anti-fuse type OTP memory cells and anti-fuse type OTP memory cell arrays.

According to one embodiment, an anti-fuse type OTP memory cell includes a first active region having a first program region with a first width and a first selection region with a second width that is greater than the first width, a second active region spaced apart from the first active region and having a second program region with a third width and a second selection region with a fourth width that is greater than the third width, a program gate intersecting the first program region and the second program region, a first selection gate intersecting the first selection region, and a second selection gate intersecting the second selection region.

According to another embodiment, an anti-fuse type OTP memory cell includes a first anti-fuse transistor having a first channel width, a first selection transistor sharing a first active region with the first anti-fuse transistor and having a second channel width that is greater than the first channel width, a second anti-fuse transistor sharing a program gate with the first anti-fuse transistor and having a third channel width, and a second selection transistor sharing a second active region with the second anti-fuse transistor and having a fourth channel width that is greater than the third channel width.

According to an embodiment, an anti-fuse type OTP memory cell includes a first anti-fuse transistor, a second anti-fuse transistor sharing a program line with the first anti-fuse transistor, a first selection transistor connected in series to the first anti-fuse transistor and connected to a first word line and a first bit line, and a second selection transistor connected in series to the second anti-fuse transistor and connected to a second word line and a second bit line.

According to an embodiment, an anti-fuse type OTP memory cell array includes a plurality of program lines extending in one direction, a plurality of word lines including a first word line and a second word line respectively disposed at both sides of each of the program lines, the word lines being parallel with the program lines, a plurality of bit lines intersecting the word lines, and a plurality of anti-fuse type OTP memory cells respectively located at cross points of the program lines and the bit lines, wherein each of the anti-fuse type OTP memory cells comprises, a first anti-fuse transistor, a second anti-fuse transistor sharing any one of the program lines with the first anti-fuse transistor, a first selection transistor connected in series to the first anti-fuse transistor and connected to any one of the first word lines, and a second selection transistor connected in series to the second anti-fuse transistor and connected to any one of the second word lines, wherein the first selection transistor shares any one of the bit lines with the second selection transistor.

According to an embodiment, an anti-fuse type OTP memory cell array includes a plurality of parallel program lines disposed in a plurality of columns, respectively, a plurality of word lines including a first word line and a second word line that are respectively disposed at both sides of each of the program lines, a plurality of bit lines disposed in a plurality of rows to intersect the program lines and the word lines, respectively, a plurality of anti-fuse transistors disposed in each column to include first anti-fuse transistors and second anti-fuse transistors, which are connected to any one of the program lines, the first anti-fuse transistors being respectively disposed at first sides of the bit lines and the second anti-fuse transistors being respectively disposed at second sides of the bit lines, and a plurality of selection transistors disposed in each column to include first selection transistors, respectively connected in series to the first anti-fuse transistors and second selection transistors, respectively connected in series to the second anti-fuse transistors, the first selection transistors in each column being connected to any one of the first word lines and the second selection transistors in each column being connected to any one of the second word lines, wherein the first and second selection transistors in each row are connected in common to any one of the bit lines.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
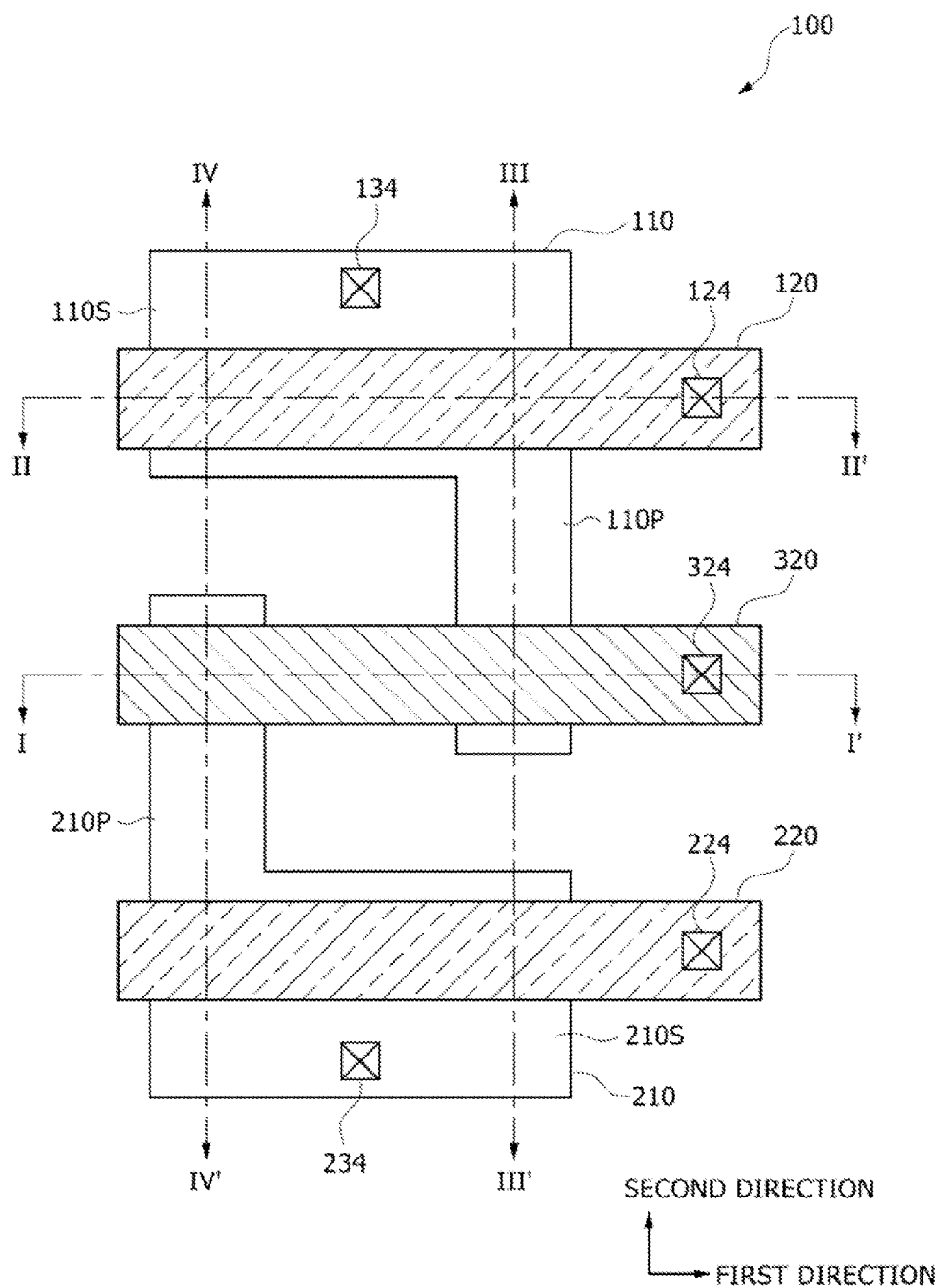
FIG. 1 is a plan view illustrating an anti-fuse type OTP memory cell according to an embodiment.

An anti-fuse element may be formed to initially have an insulated state (i.e., an electrical open state) and may be programmed to have a conductive state (i.e., an electrical short state) if a voltage equal to or greater than a critical voltage is applied thereto. Accordingly, a programmable anti-fuse element may be employed in an anti-fuse type OTP memory cell. In general, anti-fuse type OTP memory cells may include an anti-fuse transistor and a selection transistor. Anti-fuse type OTP memory cells may only be programmed once. Thus, it may be necessary to design anti-fuse type OTP memory cells to include a redundancy scheme. That is, the anti-fuse type OTP memory cell may include a couple of anti-fuse transistors and a couple of selection transistors. In such a case, the number of decoders for driving the anti-fuse type OTP memory cells may increase. A voltage applied to gates (I.e., anti-fuse memory gates or program gates) of the anti-fuse transistors may be higher than a voltage applied to gates (i.e., selection gates) of the selection transistors. Thus, the planar area where the decoders are connected to the anti-fuse transistors may be greater than the planar area that the decoders connected to the selection transistors occupy. Various embodiments of the present disclosure may provide compact anti-fuse type OTP memory cells which are capable of reducing the area of an anti-fuse type OTP memory device by minimizing the number of decoders that are connected to the anti-fuse transistors. In addition, according to the following embodiments, the amount of current flowing through a channel region of the selection transistor during a program operation may increase to improve programming efficiency.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

In the drawings, thicknesses and lengths of components are exaggerated for convenience of illustration. In the following description, a detailed explanation of known related functions and constitutions may be omitted to avoid unnecessarily obscuring the subject manner. Furthermore, 'connected/coupled' represents that one component is directly coupled to another component or indirectly coupled through another component. In this specification, a singular form may include a plural form as long as it is not specifically mentioned in a sentence. Furthermore, "include/comprise" or "including/comprising" used in the specification represents that one or more components, steps, operations, and elements exist or are added.

Figure 2:
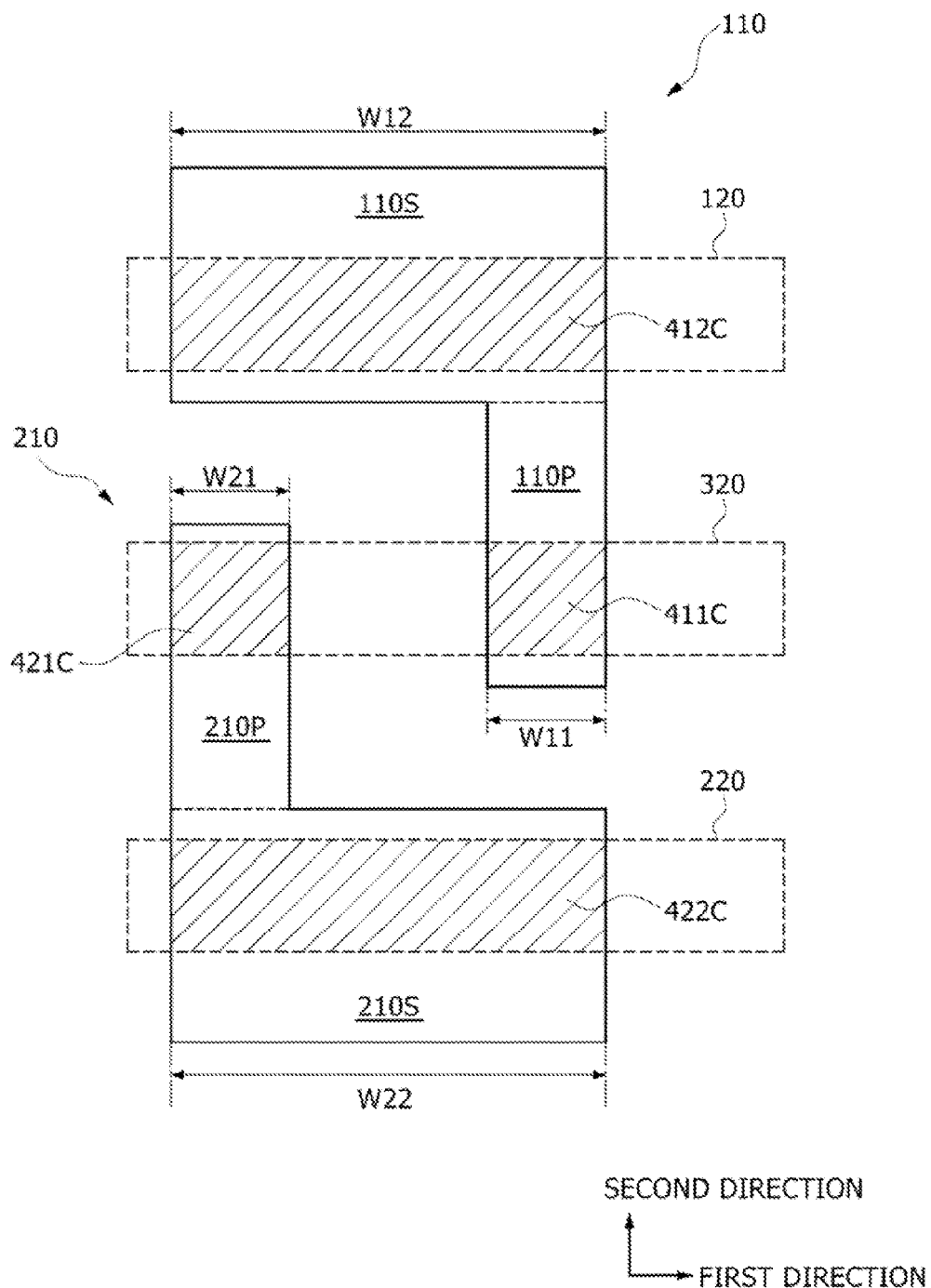
FIG. 2 is a layout diagram for explanation of sizes of a first active region and a second active region shown in FIG. 1.

FIG. 1 is a plan view illustrating an anti-fuse type OTP memory cell 100 according to an embodiment, and FIG. 2 is a layout diagram for explanation of sizes of a first active region and a second active region shown in FIG. 1. Referring to FIGS. 1 and 2, the anti-fuse type OTP memory cell 100 may include a first active region 110 and a second active region 210 that are arrayed in a second direction to face each other and are spaced apart from each other. Although not shown in FIGS. 1 and 2, the first and second active regions 110 and 210 may be defined by an isolation layer.

The first active region 110 may include a first program region 110P and a first selection region 110S. The first program region 110P may be disposed to protrude from an end of the first selection region 110S in an opposite direction (i.e., a downward direction in FIGS. 1 and 2) to the second direction. The second active region 210 may include a second program region 210P and a second selection region 210S. The second program region 210P may be disposed to protrude from an end of the second selection region 110S in the second direction (i.e., an upward direction in FIGS. 1 and 2). The first program region 110P may have a first width W11 in a first direction (i.e., a horizontal direction in FIGS. 1 and 2), perpendicular to the second direction, and the first selection region 110S may have a second width W12 which is greater than the first width W11 in the first direction. The second program region 210P may have a third width W21 in the first direction, and the second selection region 210S may have a fourth width W22, which is greater than the third width W21, in the first direction. For example, the first width W11 of the first program region 110P may substantially equal the third width W21 of the second program region 210P. In addition, the second width W12 of the first selection region 110S may substantially equal the fourth width W22 of the second selection region 210S. As described above, the first to fourth widths W11, W12, W21 and W22 may correspond to widths of the program regions 110P and 210P and the selection regions 110S and 210S in the first direction. Accordingly, the term "width" used hereafter may also mean a dimension in the first direction. The first active region 110 and the second active region 210 may be symmetric with respect to a point located between the first and second active regions 110 and 210.

A program gate (or an anti-fuse memory gate) 320 may be disposed to intersect the first program region 110P of the first active region 110 and the second program region 210P of the second active region 210. The program gate 320 may extend in the first direction to intersect the first program region 110P and the second program region 210P. The program gate 320 may also be disposed between a first selection gate 120 and a second selection gate 220 that extend in the first direction. The first selection gate 120 may extend in the first direction to intersect the first selection region 110S of the first active region 110. The first selection gate 120 may be spaced apart from the program gate 320 along the second direction. The first selection gate 120 may include a conductive layer such as a doped polysilicon layer. A first gate insulation layer (not shown) may be disposed between the first selection gate 120 and the first selection region 110S. The second selection gate 220 may extend in the first direction to intersect the second selection region 210S of the second active region 210. The second selection gate 220 may be spaced apart from the program gate 320 along the second direction. The second selection gate 220 may include a conductive layer such as a doped polysilicon layer. A second gate insulation layer (not shown) may be disposed between the second selection gate 220 and the second selection region 210S. In the present embodiment, the second direction may correspond to a direction along which carriers drift through channel regions under the first and second selection gates 120 and 220 and the program gate 320, and the first direction may be perpendicular to the second direction. Even in other embodiments, the terms "second direction" and "first direction" may also correspond to a direction along which carriers drift through channel regions under gates and the term "first direction" may also be perpendicular to the second direction, throughout the specification.

A portion of the first program region 110P, overlapping with the program gate 320, may correspond to a first channel region 411C and may have the first width W11. A portion of the second program region 210P overlapping with the program gate 320 may correspond to a second channel region 421C and may have the third width W21. A portion of the first selection region 110S overlapping with the first selection gate 120 may correspond to a third channel region 412C and may have the second width W12. A portion of the second selection region 210S overlapping with the second selection gate 220 may correspond to a fourth channel region 422C and may have the fourth width W22.

The first selection gate 120 may be electrically connected to a first word line (not shown) through a first contact 124, and the second selection gate 220 may be electrically connected to a second word line (not shown) through a second contact 224. The program gate 320 may be electrically connected to a program line (not shown) through a third contact 324. The first selection region 110S, adjacent to one side of the first selection gate 120, which is opposite to the first program region 110P, may be electrically connected to a first bit line (not shown) through a fourth contact 134. The second selection region 210S, adjacent to one side of the second selection gate 220, which is opposite to the second program region 210P, may be electrically connected to a second bit line (not shown) through a fifth contact 234. Although not shown in FIGS. 1 and 2, a first impurity diffusion region may be disposed in the first selection region 110S that is adjacent to one side of the first selection gate 120 to contact the fourth contact 134, and a third impurity diffusion region may be disposed in the second selection region 210S that is adjacent to one side of the second selection gate 220 to contact the fifth contact 234. In addition, a second impurity diffusion region may be disposed in the first active region 110 between the first selection gate 120 and the program gate 320, and a fourth impurity diffusion region may be disposed in the second active region 210 between the second selection gate 220 and the program gate 320.

Figure 3:
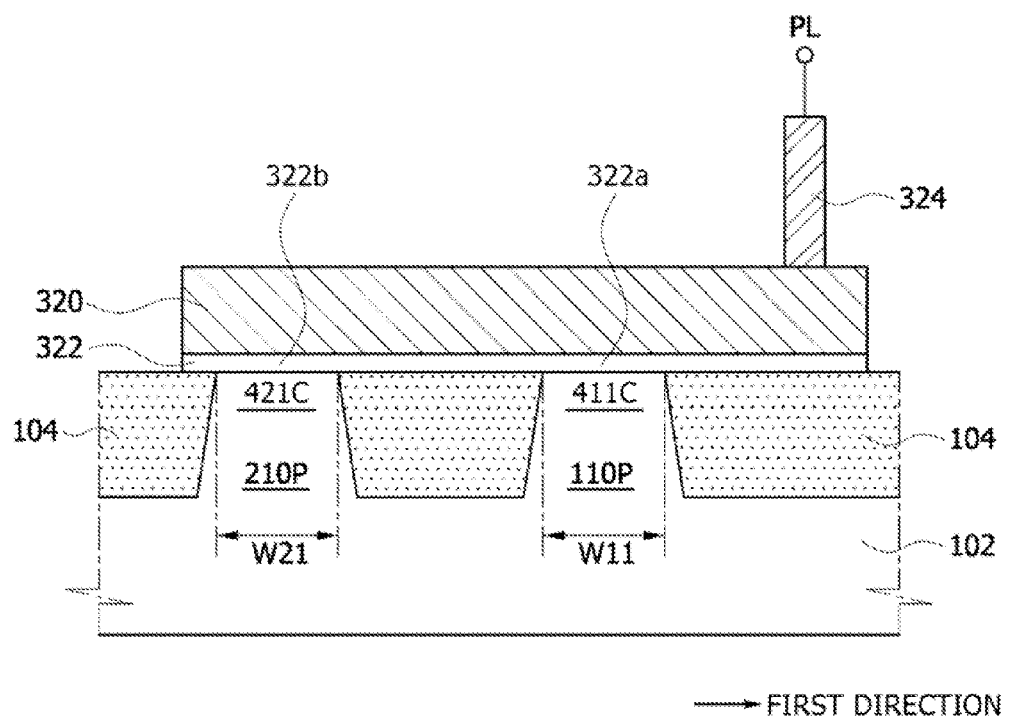
FIG. 3 is a cross-sectional view taken along a line I-I' of FIG. 1.

FIG. 3 is a cross-sectional view taken along a line I-I' of FIG. 1. Referring to FIG. 3, the first and second active regions 110 and 210 may be arrayed in a substrate 102 along the first direction to be spaced apart from each other. The first and second active regions 110 and 210 may be defined by an isolation layer 104. For example, the isolation layer 104 may be a trench isolation layer or a field insulation layer. An anti-fuse insulation layer 322 and the program gate 320 may be sequentially stacked on the substrate 102. The anti-fuse insulation layer 322 may include a first anti-fuse insulation layer 322a overlapping with a portion of the first program region 110P in the first active region 110 and a second anti-fuse insulation layer 322b overlapping with a portion of the second program region 210P in the second active region 110. The program gate 320 may be connected to a program line PL through the second contact 324. For example, the anti-fuse insulation layer 322 may include a silicon oxide layer, and the program gate 320 may include a doped polysilicon layer. An upper region of the first program region 110P, overlapping with the program gate 320, may correspond to the first channel region 411C. An upper region of the second program region 210P, overlapping with the program gate 320, may correspond to the second channel region 421C. The first program region 110P, overlapping with the program gate 320, may have the first width W11 in the first direction which is parallel with the program gate 320. The second program region 210P, overlapping with the program gate 320, may have the third width W21 in the first direction, which is parallel with the program gate 320. For example, the first width W11 may be substantially equal to the third width W21.

Figure 4:
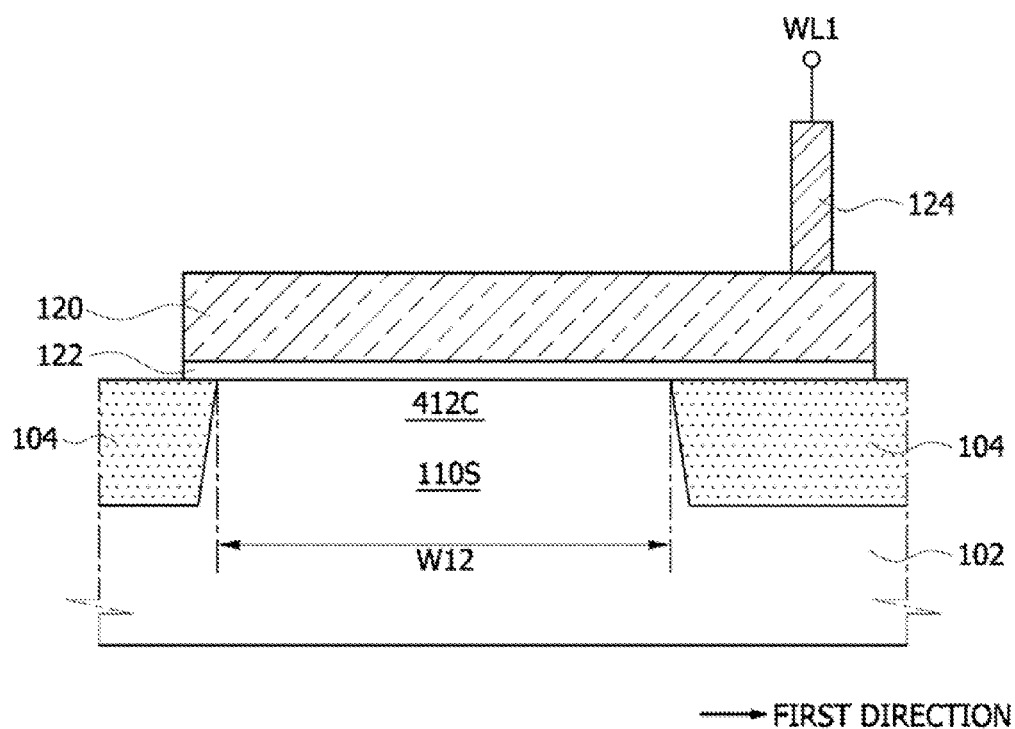
FIG. 4 is a cross-sectional view taken along a line II-II' of FIG. 1.

FIG. 4 is a cross-sectional view taken along a line II-II' of FIG. 1. Referring to FIG. 4, a first gate insulation layer 122 and the first selection gate 120 may be sequentially stacked on the substrate 102. As described with reference to FIG. 1, the first gate insulation layer 122 and the first selection gate 120 may overlap with a portion of the first selection region 110S of the first active region 110. An upper region of the first selection region 110S, overlapping with the first selection gate 120, may correspond to the third channel region 412C. The first selection gate 120 may be electrically connected to a first word line WL1 through the first contact 124. For example, the first gate insulation layer 122 may include a silicon oxide layer, and the first selection gate 120 may include a doped polysilicon layer. The third channel region 412C overlapping with the first selection gate 120 may have the second width W12 in the first direction, which is parallel with the first selection gate 120. A cross-sectional view taken along the second selection gate 220 in the first direction and may have a structure substantially the same as the cross-sectional view of FIG. 4.

Figure 5:
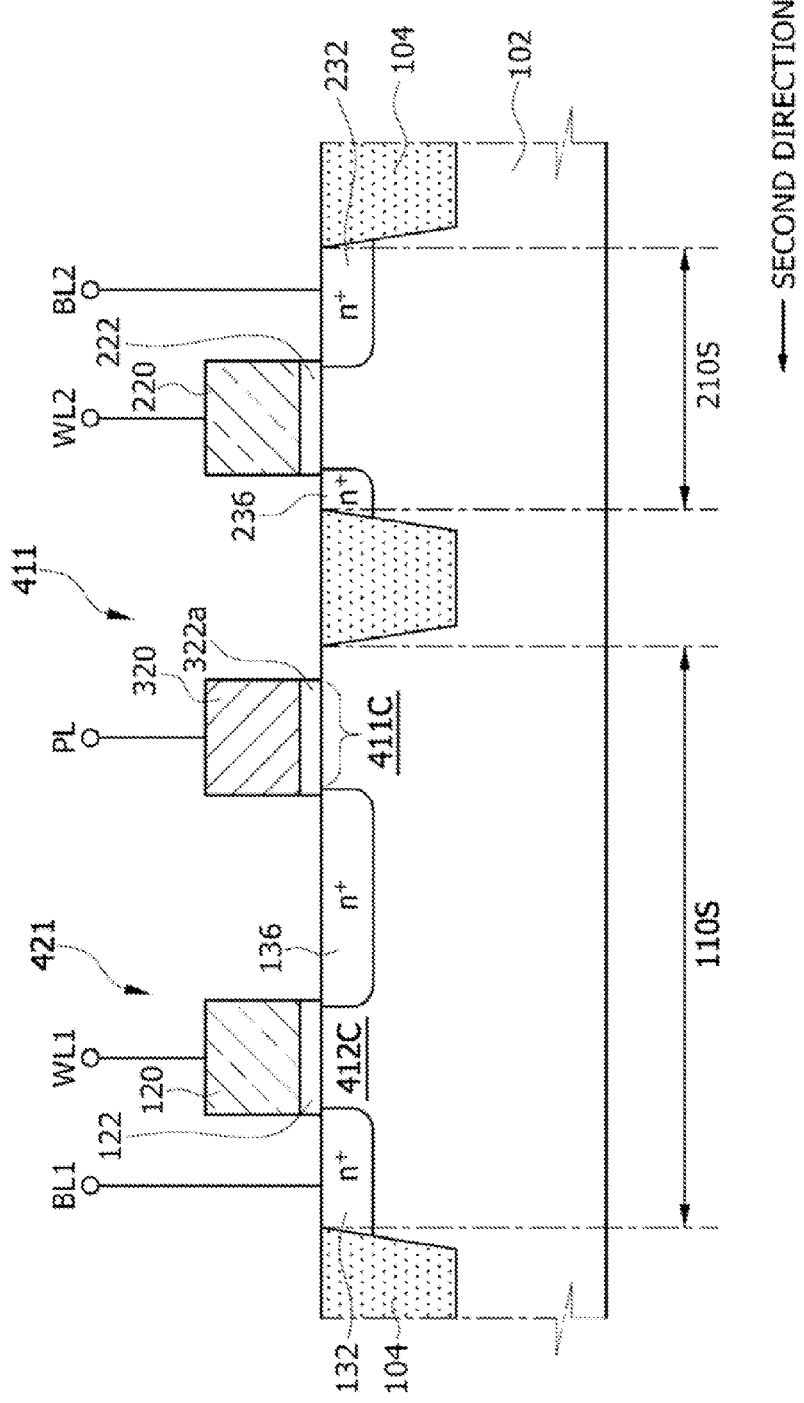
FIG. 5 is a cross-sectional view taken along a line III-III' of FIG. 1.

FIG. 5 is a cross-sectional view taken along a line III-III' of FIG. 1. Referring to FIG. 5, the first gate insulation layer 122 and the first selection gate 120 may be sequentially stacked on a portion of the first selection region 110S included in the first active region 110 defined in the substrate 102. The first selection gate 120 may be electrically connected to the first word line WL1. The first anti-fuse insulation layer 322a and the program gate 320 may be sequentially stacked on another portion of the first selection region 110S defined in the substrate 102. The program gate 320 may be electrically connected to the program line PL. The first gate insulation layer 122 and the first anti-fuse insulation layer 322a may be spaced apart from each other along the second direction, and the first selection gate 120 and the program gate 320 may also be spaced apart from each other along the second direction. A second gate insulation layer 222 and the second selection gate 220 may be sequentially stacked on a portion of the second selection region 210S included in the second active region 210 defined in the substrate 102. The second selection gate 220 may be electrically connected to a second word line WL2.

A first impurity diffusion region 132 may be disposed in an upper region of the first selection region 110S that is adjacent to one side of the first selection gate 120 opposite to the program gate 320. An end of the first impurity diffusion region 132 may overlap with an end of the first selection gate 120. A second impurity diffusion region 136 may be disposed in an upper region of the first selection region 110S between the first selection gate 120 and the program gate 320. Two opposite ends of the second impurity diffusion region 132 may overlap with an end of the first selection gate 120 and an end of the program gate 320, respectively. A third impurity diffusion region 232 may be disposed in an upper region of the second selection region 210S that is adjacent to one side of the second selection gate 220 opposite to the program gate 320. A fourth impurity diffusion region 236 may be disposed in an upper region of the second selection region 210S that is adjacent to the other side of the second selection gate 220 opposite to the third impurity diffusion region 232. An end of the third impurity diffusion region 232 may overlap with one end of the second selection gate 220, and an end of the fourth impurity diffusion region 236 may overlap with the other end of the second selection gate 220. For example, if the substrate 102 is P-type (has P-type impurities), the first, second, third and fourth impurity diffusion regions 132, 136, 232 and 236 may be N-type (have N-type impurities). Although not shown in the drawings, each of the first, second, third and fourth impurity diffusion regions 132, 136, 232 and 236 may have a lightly doped drain (LDD) structure. The first impurity diffusion region 132 may be electrically connected to a first bit line BL1 through the fourth contact 134, and the third impurity diffusion region 232 may be electrically connected to a second bit line BL2 through the fifth contact 234.

The first gate insulation layer 122, the first selection gate 120, the first impurity diffusion region 132 and the second impurity diffusion region 136 may constitute a first selection transistor 421 having a MOS structure. In this case, the first impurity diffusion region 132 and the second impurity diffusion region 136 may act as a drain region and a source region of the first selection transistor 421, respectively. An upper region of the first selection region 110S, between the first and second impurity diffusion regions 132 and 136, may correspond to the third channel region 412C. The third channel region 412C may have a channel length that corresponds to the distance between the first and second impurity diffusion regions 132 and 136. The third channel region 412C may have the second width W12, as described with reference to FIG. 2.

The first anti-fuse insulation layer 322a, the program gate 320 and the second impurity diffusion region 136 may constitute a first anti-fuse transistor 411 having a half-MOS structure. An upper region of the first selection region 110S, overlapping with the program gate 320, may correspond to the first channel region 411C that acts as a channel region of the first anti-fuse transistor 411. As described above, the first anti-fuse transistor 411 may have a half-MOS structure including one impurity diffusion region. Thus, a program operation and a read operation of the first anti-fuse transistor 411 may be performed regardless of the first channel region 411C. The first channel region 411C may have the first width W11, as described with reference to FIG. 2. The second width W12 of the third channel region 412C may be two or more times larger than the first width W11 of the first channel region 411C.

Figure 6:
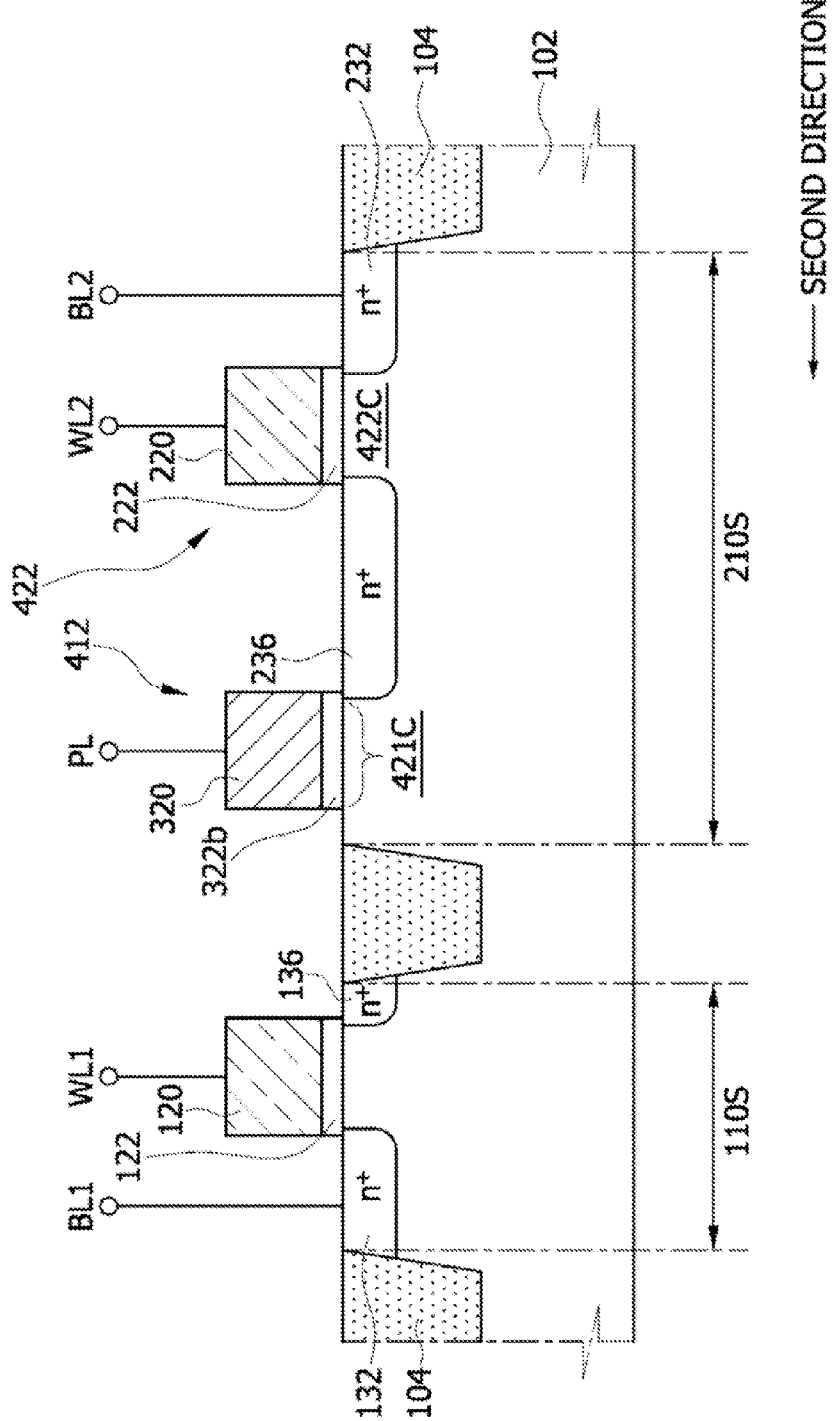
FIG. 6 is a cross-sectional view taken along a line IV-IV' of FIG. 1.

FIG. 6 is a cross-sectional view taken along a line IV-IV' of FIG. 1. Referring to FIG. 6, the first gate insulation layer 122 and the first selection gate 120 may be sequentially stacked on a portion of the first selection region 110S, defined in the substrate 102. The first selection gate 120 may be electrically connected to the first word line WL1. The second anti-fuse insulation layer 322b and the program gate 320 may be sequentially stacked on a portion of the second selection region 210S defined in the substrate 102. The program gate 320 may be electrically connected to the program line PL. The second gate insulation layer 222 and the second selection gate 220 may be sequentially stacked on another portion of the second selection region 210S defined in the substrate 102. The second selection gate 220 may be electrically connected to the second word line WL2. The second gate insulation layer 222 and the second anti-fuse insulation layer 322b may be spaced apart from each other along the second direction, and the second selection gate 220 and the program gate 320 may also be spaced apart from each other along the second direction.

The first impurity diffusion region 132 may be disposed in an upper region of the first selection region 110S that is adjacent to one side of the first selection gate 120, opposite to the program gate 320. The second impurity diffusion region 136 may be disposed in an upper region of the first selection region 110S that is adjacent to the other side of the first selection gate 120, opposite to the first impurity diffusion region 132. An end of the first impurity diffusion region 132 may overlap with one end of the first selection gate 120, and an end of the second impurity diffusion region 136 may overlap with the other end of the first selection gate 120. The third impurity diffusion region 232 may be disposed in an upper region of the second selection region 210S that is adjacent to one side of the second selection gate 220, opposite to the program gate 320. An end of the third impurity diffusion region 232 may overlap with one end of the second selection gate 220. The fourth impurity diffusion region 236 may be disposed in an upper region of the second selection region 210S, between the second selection gate 220 and the program gate 320. Two opposite ends of the fourth impurity diffusion region 236 may overlap with an end of the second selection gate 220 and an end of the program gate 320, respectively. For example, if the substrate 102 is P-type, the first, second, third and fourth impurity diffusion regions 132, 136, 232 and 236 may be N-type. Although not shown in the drawings, each of the first, second, third and fourth impurity diffusion regions 132, 136, 232 and 236 may have a lightly doped drain (LDD) structure. The first impurity diffusion region 132 may be electrically connected to the first bit line BL1 through the fourth contact 134, and the third impurity diffusion region 232 may be electrically connected to the second bit line BL2 through the fifth contact 234.

The second gate insulation layer 222, the second selection gate 220, the third impurity diffusion region 232 and the fourth impurity diffusion region 236 may constitute a second selection transistor 422 having a MOS structure. In this case, the third impurity diffusion region 232 and the fourth impurity diffusion region 236 may act as a drain region and a source region of the second selection transistor 422, respectively. An upper region of the second selection region 210S, between the third and fourth impurity diffusion regions 232 and 236, may correspond to the fourth channel region 422C. The fourth channel region 422C may have a channel length that corresponds to the distance between the third and fourth impurity diffusion regions 232 and 236. The fourth channel region 422C may have the fourth width W22, as described with reference to FIG. 2. For example, the fourth width W22 of the fourth channel region 422C may be substantially equal to the second width W12 of the third channel region 412C.

The second anti-fuse insulation layer 322b, the program gate 320 and the fourth impurity diffusion region 236 may constitute a second anti-fuse transistor 412 having a half-MOS structure. An upper region of the second selection region 210S, overlapping with the program gate 320, may correspond to the second channel region 421C that acts as a channel region of the second anti-fuse transistor 412. As described above, the second anti-fuse transistor 412 may have a half-MOS structure including one impurity diffusion region. Thus, a program operation and a read operation of the second anti-fuse transistor 412 may be performed regardless of the second channel region 421C. The second channel region 421C may have the third width W21, as described with reference to FIG. 2. For example, the third width W21 of the second channel region 421C may be substantially equal to the first width W11 of the first channel region 411C. The fourth width W22 of the fourth channel region 422C may be greater than the third width W21 of the second channel region 421C. For example, the fourth width W22 of the fourth channel region 422C may be two or more times that of the third width W21 of the second channel region 421C.

Figure 7:
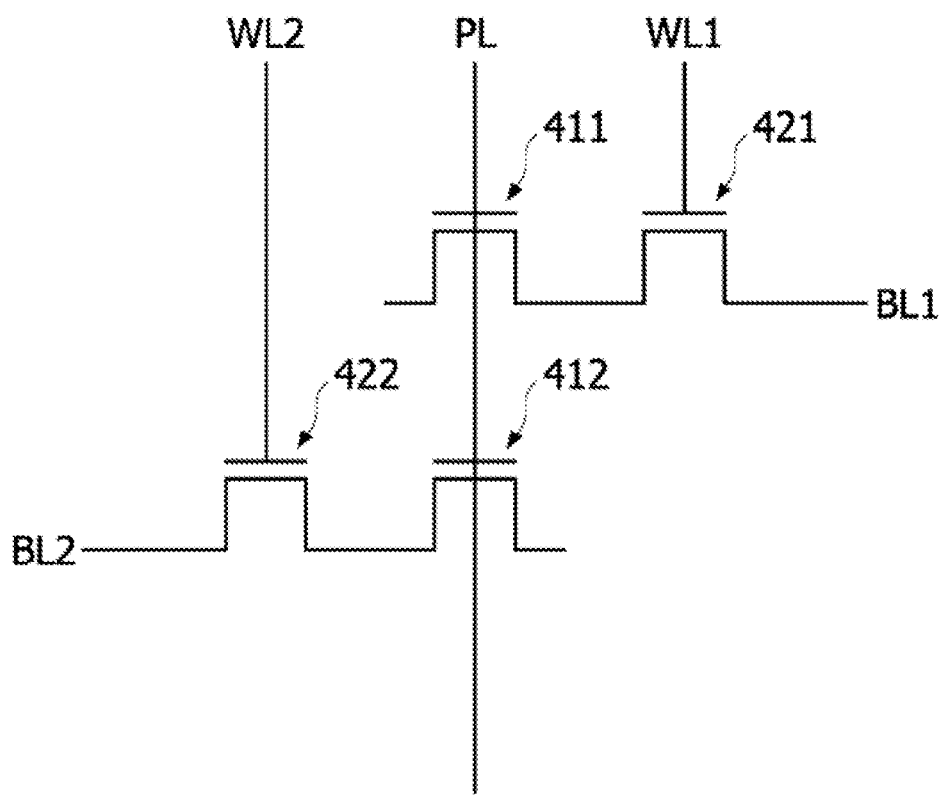
FIG. 7 is an equivalent circuit diagram of the anti-fuse type OTP memory cell shown in FIG. 1.

FIG. 7 is an equivalent circuit diagram of the anti-fuse type OTP memory cell shown in FIG. 1. Referring to FIG. 7, the first anti-fuse transistor 411 may share the program gate (320 of FIGS. 1 to 6) with the second anti-fuse transistor 412. Thus, the first anti-fuse transistor 411 may also share the program line PL connected to the program gate 320 with the second anti-fuse transistor 412. The first selection transistor 421 and the first anti-fuse transistor 411 may be connected in series. That is, as described with reference to FIG. 5, the first selection transistor 421 may share the second impurity diffusion region 136 with the first anti-fuse transistor 411. As described with reference to FIG. 5, the first anti-fuse transistor 411 may have a half-MOS structure. Thus, if the second impurity diffusion region 136 corresponds to a drain region of the first anti-fuse transistor 411, a source region of the first anti-fuse transistor 411 may float. The first selection gate (120 of FIGS. 1 to 6), acting as a gate of the first selection transistor 421, may be electrically connected to the first word line WL1, and the first impurity diffusion region (132 of FIGS. 1 to 6), acting as a drain region of the first selection transistor 421, may be electrically connected to the first bit line BL1. The second selection transistor 422 and the second anti-fuse transistor 412 may be connected in series. That is, as described with reference to FIG. 6, the second selection transistor 422 may share the fourth impurity diffusion region 236 with the second anti-fuse transistor 412. As described with reference to FIG. 6, the second anti-fuse transistor 412 may have a half-MOS structure. Thus, if the fourth impurity diffusion region 236 corresponds to a drain region of the second anti-fuse transistor 412, a source region of the second anti-fuse transistor 412 may float. The second selection gate (220 of FIGS. 1 to 6), acting as a gate of the second selection transistor 422, may be electrically connected to the second word line WL2, and the third impurity diffusion region (232 of FIGS. 1 to 6) acting as a drain region of the second selection transistor 422 may be electrically connected to the second bit line BL2.

As described with reference to FIGS. 1 to 6, the second width W12 of the third channel region 412C of the first selection transistor 421 may be greater than the first width W11 of the first channel region 411C of the first anti-fuse transistor 411. In addition, the fourth width W22 of the fourth channel region 422C of the second selection transistor 422 may be greater than the third width W21 of the second channel region 421C of the second anti-fuse transistor 412. For example, the second width W12 of the third channel region 412C of the first selection transistor 421 may be substantially equal to the fourth width W22 of the fourth channel region 422C of the second selection transistor 422. Moreover, the first width W11 of the first channel region 411C of the first anti-fuse transistor 411 may be substantially equal to the third width W21 of the second channel region 421C of the second anti-fuse transistor 412.

Figure 8:
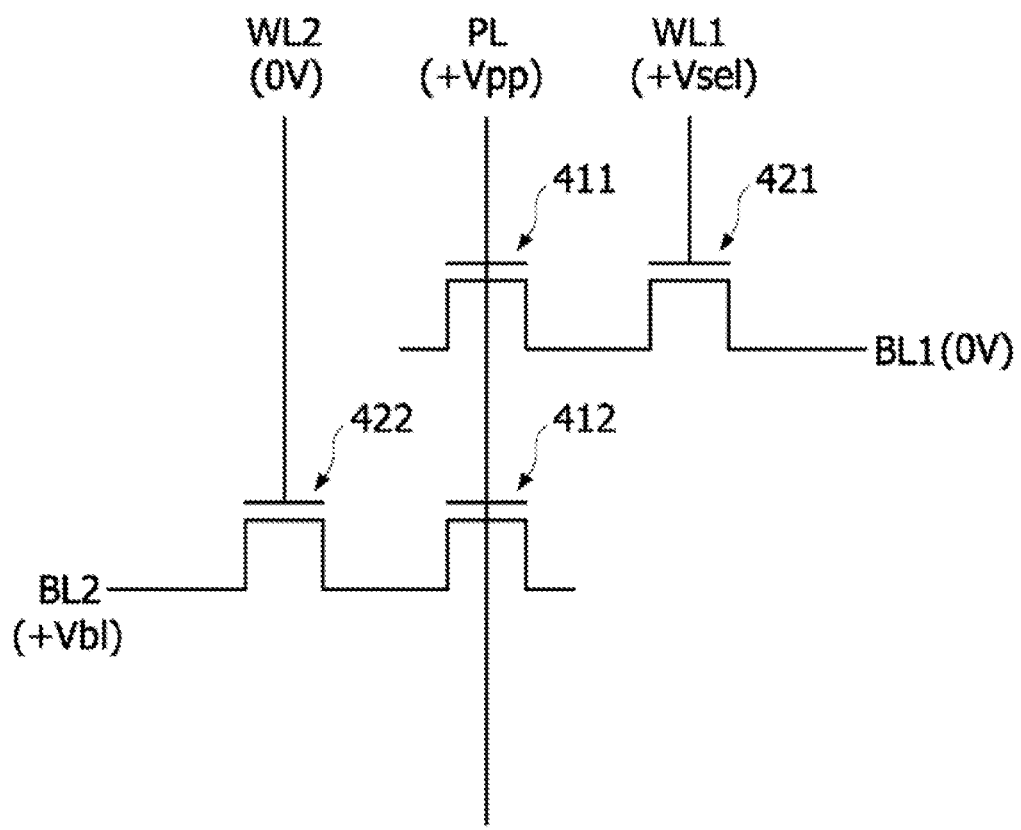
FIGS. 8 and 9 are circuit diagrams illustrating program operations of the anti-fuse type OTP memory cell shown in FIG. 7.
Figure 9:
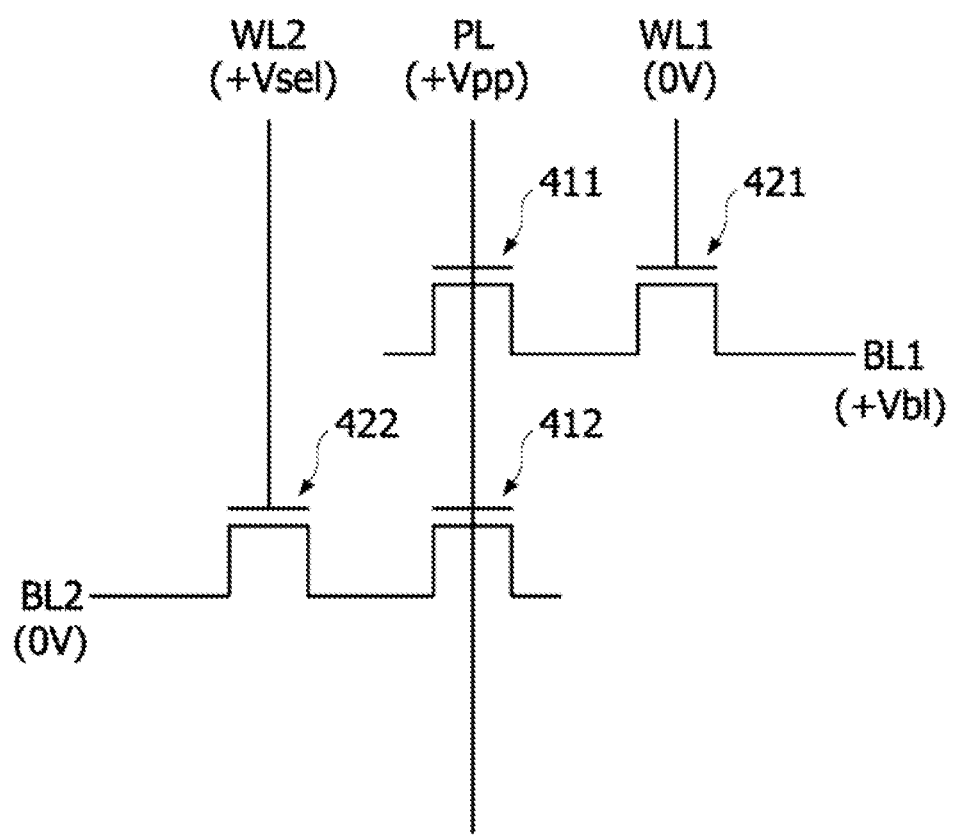

FIGS. 8 and 9 are circuit diagrams illustrating program operations of the anti-fuse type OTP memory cell shown in FIG. 7. Referring to FIGS. 5, 7 and 8, a positive program voltage +Vpp may be applied to the program line PL to program the first anti-fuse transistor 411. For example, the positive program voltage +Vpp may be set to be about 6 volts. Moreover, a positive selection voltage +Vsel may be applied to the first word line WL1 connected to the first selection gate 120 of the first selection transistor 421 connected to the first anti-fuse transistor 411. The positive selection voltage +Vsel may be set to have a voltage level which is capable of turning on the first selection transistor 421. For example, the positive selection voltage +Vsel may be set to be about 3 volts. In contrast, a ground voltage may be applied to the second word line WL2, connected to the second selection gate 220 of the second selection transistor 422, to turn off the second selection transistor 422. In addition, a ground voltage may also be applied to the first bit line BL1, connected to the first selection transistor 421, and a positive bit line voltage +Vbl may be applied to the second bit line BL2, connected to the second selection transistor 422. The positive bit line voltage +Vbl may be set to an appropriate voltage level so that the voltage difference between the positive bit line voltage +Vbl and the positive program voltage +Vpp prevents the second anti-fuse insulation layer 322b of the second anti-fuse transistor 412 from rupturing. For example, if the positive program voltage +Vpp has a voltage level of about 6 volts, the positive bit line voltage +Vbl may be set to have a voltage level of about 3 volts. Alternatively, the second bit line BL2 may be grounded if the second selection transistor 422 is turned off.

Under the above bias condition, the first selection transistor 421 may be turned on and the second selection transistor 422 may be turned off. If the first selection transistor 421 is turned on, the first anti-fuse insulation layer 322a may be ruptured by a voltage difference between the positive program voltage +Vpp applied to the program line PL and the ground voltage applied to the first bit line BL1. In such a case, conductive filaments may be formed in the first anti-fuse insulation layer 322a to allow a program current to flow from the program gate (320 of FIG. 5) into the second impurity diffusion region (136 of FIG. 5) through the ruptured first anti-fuse insulation layer 322a of the first anti-fuse transistor 411. That is, the first anti-fuse transistor 411 may be programmed to electrically connect the program line PL to the second impurity diffusion region 136. During the program operation of the first anti-fuse transistor 411, the first selection transistor 421 may supply sufficient current to the second impurity diffusion region 136 and the first anti-fuse insulation layer 322a because the second width W12, corresponding to a channel width of the first selection transistor 421, is greater than the first width W11 corresponding to a channel width of the first anti-fuse transistor 411. As a result, program efficiency of the anti-fuse type OTP memory cell illustrated in FIG. 7 may be improve compared with an anti-fuse type OTP memory cell including a first selection transistor and a first anti-fuse transistor having the same channel width. While the first anti-fuse transistor 411 is programmed, the second anti-fuse transistor 412 is not programmed because the second selection transistor 422 is turned off. However, even if the second selection transistor 422 is turned on due to malfunction or the like, the second anti-fuse transistor 412 may not be programmed because the voltage difference between the positive program voltage +Vpp applied to the program line PL and the positive bit line voltage +Vbl applied to the second bit line BL2 is lower than the critical voltage, which is capable of rupturing the second anti-fuse insulation layer 322b of the second anti-fuse transistor 412.

Referring to FIGS. 6, 7 and 9, the positive program voltage +Vpp may be applied to the program line PL to program the second anti-fuse transistor 412. For example, the positive program voltage +Vpp may be set to be about 6 volts. Moreover, the positive selection voltage +Vsel may be applied to the second word line WL2, connected to the second selection gate 220 of the second selection transistor 422, connected to the second anti-fuse transistor 412. The positive selection voltage +Vsel may be set to have a voltage level which is capable of turning on the second selection transistor 422. For example, the positive selection voltage +Vsel may be set to be about 3 volts. In contrast, a ground voltage may be applied to the first word line WL1, connected to the first selection gate 120, of the first selection transistor 421 to turn off the first selection transistor 421. In addition, a ground voltage may also be applied to the second bit line BL2, connected to the second selection transistor 422, and the positive bit line voltage +Vbl may be applied to the first bit line BL1 connected to the first selection transistor 421. The positive bit line voltage +Vbl may be set to an appropriate voltage level so that the voltage difference between the positive bit line voltage +Vbl and the positive program voltage +Vpp prevents the first anti-fuse insulation layer 322a of the first anti-fuse transistor 411 from rupturing. For example, if the positive program voltage +Vpp has a voltage level of about 6 volts, the positive bit line voltage +Vbl may be have a voltage level of about 3 volts. Alternatively, the first bit line BL1 may be grounded if the first selection transistor 421 is turned off.

Under the above bias condition, the second selection transistor 422 may be turned on and the first selection transistor 421 may be turned off. If the second selection transistor 422 is turned on, the second anti-fuse insulation layer 322b may be ruptured by a voltage difference between the positive program voltage +Vpp applied to the program line PL and the ground voltage applied to the second bit line BL2. In such a case, conductive filaments may be formed in the second anti-fuse insulation layer 322b to allow a program current to flow from the program gate (320 of FIG. 6) into the fourth impurity diffusion region (236 of FIG. 6) through the ruptured second anti-fuse insulation layer 322b of the second anti-fuse transistor 412. That is, the second anti-fuse transistor 412 may be programmed to electrically connect the program line PL to the fourth impurity diffusion region 236. During the program operation of the second anti-fuse transistor 412, the second selection transistor 422 may supply sufficient current to the fourth impurity diffusion region 236 and the second anti-fuse insulation layer 322b because the fourth width W22, corresponding to a channel width of the second selection transistor 422, is greater than the third width W21 corresponding to a channel width of the second anti-fuse transistor 412. As a result, program efficiency of the anti-fuse type OTP memory cell illustrated in FIG. 7 may be improved compared with an anti-fuse type OTP memory cell including a second selection transistor and a second anti-fuse transistor having the same channel width. While the second anti-fuse transistor 412 is programmed, the first anti-fuse transistor 411 is not programmed because the first selection transistor 421 is turned off. However, even if the first selection transistor 421 is turned on due to malfunction or the like, the first anti-fuse transistor 411 may not be programmed because the voltage difference between the positive program voltage +Vpp, applied to the program line PL, and the positive bit line voltage +Vbl, applied to the first bit line BL1, is lower than the critical voltage, which is capable of rupturing the first anti-fuse insulation layer 322a of the first anti-fuse transistor 411.

Figure 10:
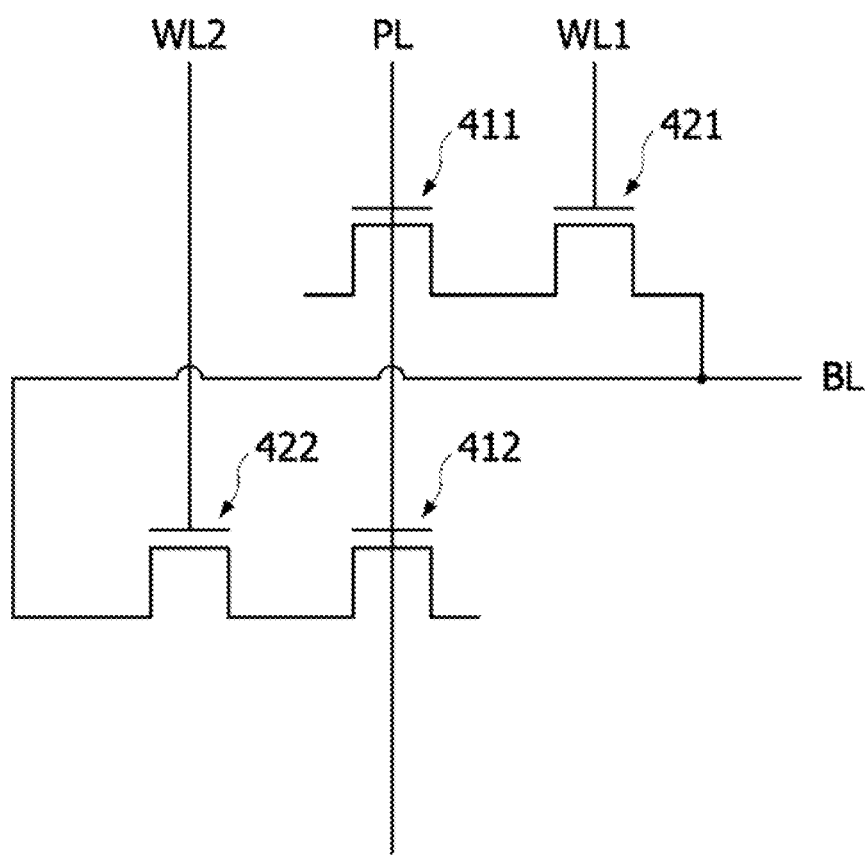
FIG. 10 is another equivalent circuit diagram of the anti-fuse type OTP memory cell shown in FIG. 1.

FIG. 10 is another equivalent circuit diagram of the anti-fuse type OTP memory cell shown in FIG. 1. Referring to FIG. 10, the equivalent circuit diagram of the anti-fuse type OTP memory cell according to the present embodiment may be similar to the equivalent circuit diagram of the anti-fuse type OTP memory cell illustrated in FIG. 7. Thus, descriptions of the same configurations as described with reference to FIG. 7 will be omitted or briefly mentioned in the present embodiment to avoid duplicate explanations. According to the present embodiment, the first selection transistor 421 may share a single bit line BL with the second selection transistor 422. In the present embodiment, any one of the first and second anti-fuse transistors 411 and 412 may be selected according to a combination of bias voltages applied to the first and second word lines WL1 and WL2.

Figure 11:
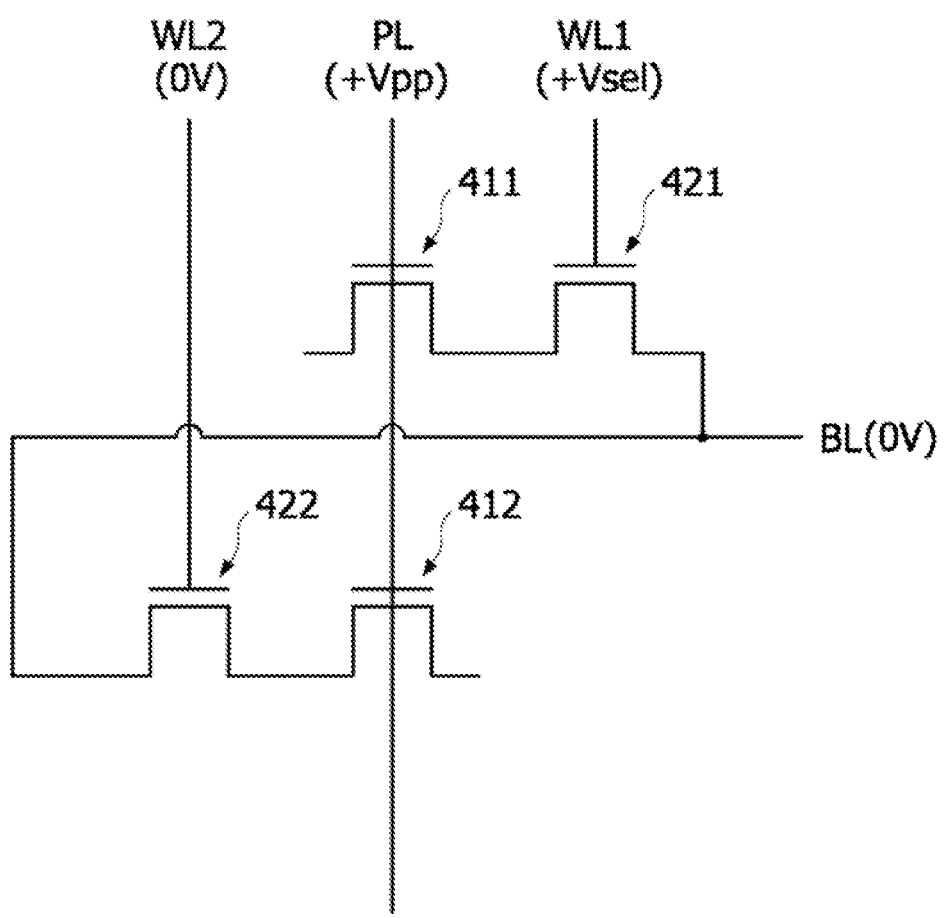
FIGS. 11 and 12 are circuit diagrams illustrating program operations of the anti-fuse type OTP memory cell shown in FIG. 10.
Figure 12:
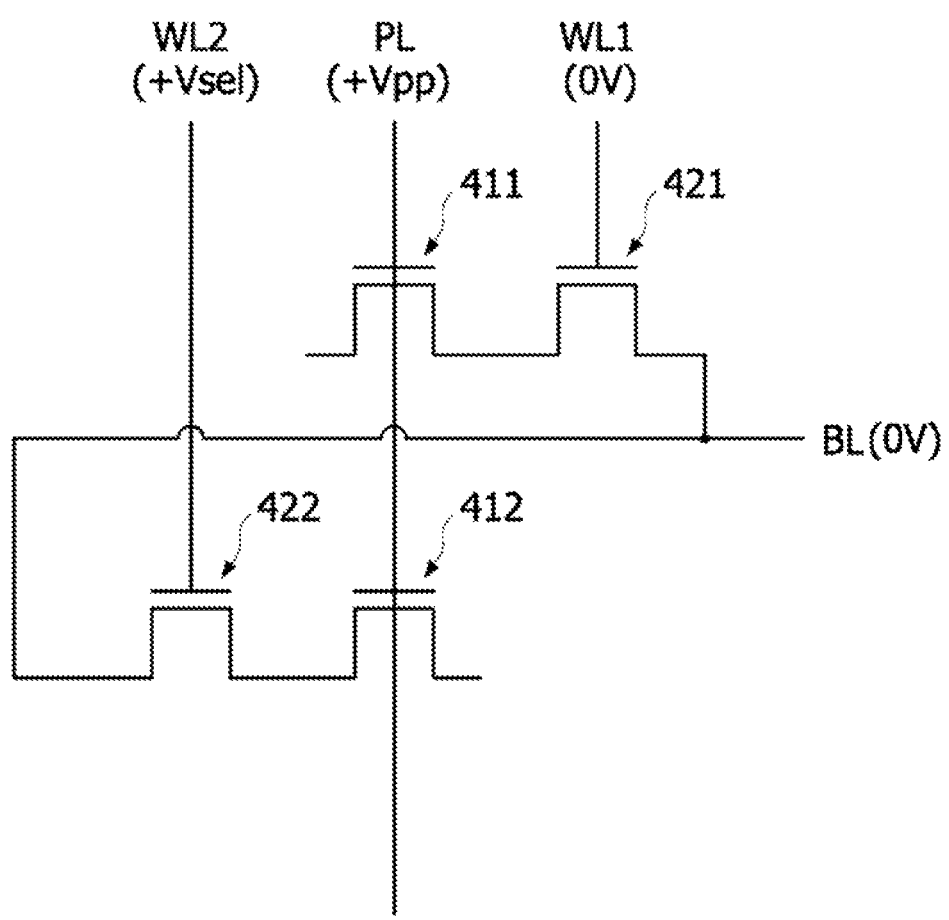

FIGS. 11 and 12 are circuit diagrams illustrating program operations of the anti-fuse type OTP memory cell shown in FIG. 10. Referring to FIGS. 5, 10 and 11, a positive program voltage +Vpp may be applied to the program line PL to program the first anti-fuse transistor 411. For example, the positive program voltage +Vpp may be set to be about 6 volts. Moreover, a positive selection voltage +Vsel may be applied to the first word line WL1, connected to the first selection gate 120 of the first selection transistor 421, connected to the first anti-fuse transistor 411. The positive selection voltage +Vsel may be set to have a voltage level which is capable of turning on the first selection transistor 421. For example, the positive selection voltage +Vsel may be set to be about 3 volts. In contrast, a ground voltage may be applied to the second word line WL2, connected to the second selection gate 220, of the second selection transistor 422 to turn off the second selection transistor 422. In addition, a ground voltage may also be applied to the bit line BL which is connected in common to the first and second selection transistors 421 and 422.

Under the above bias conditions, the first selection transistor 421 may be turned on and the second selection transistor 422 may be turned off. If the first selection transistor 421 is turned on, the first anti-fuse insulation layer 322a may be ruptured by a voltage difference between the positive program voltage +Vpp applied to the program line PL and the ground voltage applied to the bit line BL. In such a case, conductive filaments may be formed in the first anti-fuse insulation layer 322a to allow a program current to flow from the program gate (320 of FIG. 5) into the second impurity diffusion region (136 of FIG. 5) through the ruptured first anti-fuse insulation layer 322a of the first anti-fuse transistor 411. That is, the first anti-fuse transistor 411 may be programmed to electrically connect the program line PL to the second impurity diffusion region 136. During the program operation of the first anti-fuse transistor 411, the first selection transistor 421 may supply sufficient current to the second impurity diffusion region 136 and the first anti-fuse insulation layer 322a because the second width W12, corresponding to a channel width of the first selection transistor 421, is greater than the first width W11 corresponding to a channel width of the first anti-fuse transistor 411. As a result, program efficiency of the anti-fuse type OTP memory cell illustrated in FIG. 10 may be improved compared with an anti-fuse type OTP memory cell including a first selection transistor and a first anti-fuse transistor having the same channel width. While the first anti-fuse transistor 411 is programmed, the second anti-fuse transistor 412 is not programmed because the second selection transistor 422 is turned off.

Referring to FIGS. 6, 10 and 12, the positive program voltage +Vpp may be applied to the program line PL to program the second anti-fuse transistor 412. For example, the positive program voltage +Vpp may be set to be about 6 volts. Moreover, the positive selection voltage +Vsel may be applied to the second word line WL2, connected to the second selection gate 220 of the second selection transistor 422, connected to the second anti-fuse transistor 412. The positive selection voltage +Vsel may be set to have a voltage level which is capable of turning on the second selection transistor 422. For example, the positive selection voltage +Vsel may be set to be about 3 volts. In contrast, a ground voltage may be applied to the first word line WL1, connected to the first selection gate 120 of the first selection transistor 421, to turn off the first selection transistor 421. In addition, a ground voltage may also be applied to the bit line BL that is connected in common to the first and second selection transistors 421 and 422.

Under the above bias conditions, the second selection transistor 422 may be turned on and the first selection transistor 421 may be turned off. If the second selection transistor 422 is turned on, the second anti-fuse insulation layer 322b may be ruptured by a voltage difference between the positive program voltage +Vpp applied to the program line PL and the ground voltage applied to the bit line BL. In such a case, conductive filaments may be formed in the second anti-fuse insulation layer 322b to allow a program current to flow from the program gate (320 of FIG. 6) into the fourth impurity diffusion region (236 of FIG. 6) through the ruptured second anti-fuse insulation layer 322b of the second anti-fuse transistor 412. That is, the second anti-fuse transistor 412 may be programmed to electrically connect the program line PL to the fourth impurity diffusion region 236. During the program operation of the second anti-fuse transistor 412, the second selection transistor 422 may supply sufficient current to the fourth impurity diffusion region 236 and the second anti-fuse insulation layer 322b because the fourth width W22, corresponding to a channel width of the second selection transistor 422, is greater than the third width W21, corresponding to a channel width of the second anti-fuse transistor 412. As a result, program efficiency of the anti-fuse type OTP memory cell illustrated in FIG. 10 may be improved compared with an anti-fuse type OTP memory cell including a second selection transistor and a second anti-fuse transistor having the same channel width. While the second anti-fuse transistor 412 is programmed, the first anti-fuse transistor 411 is not programmed because the first selection transistor 421 is turned off.

Figure 13:
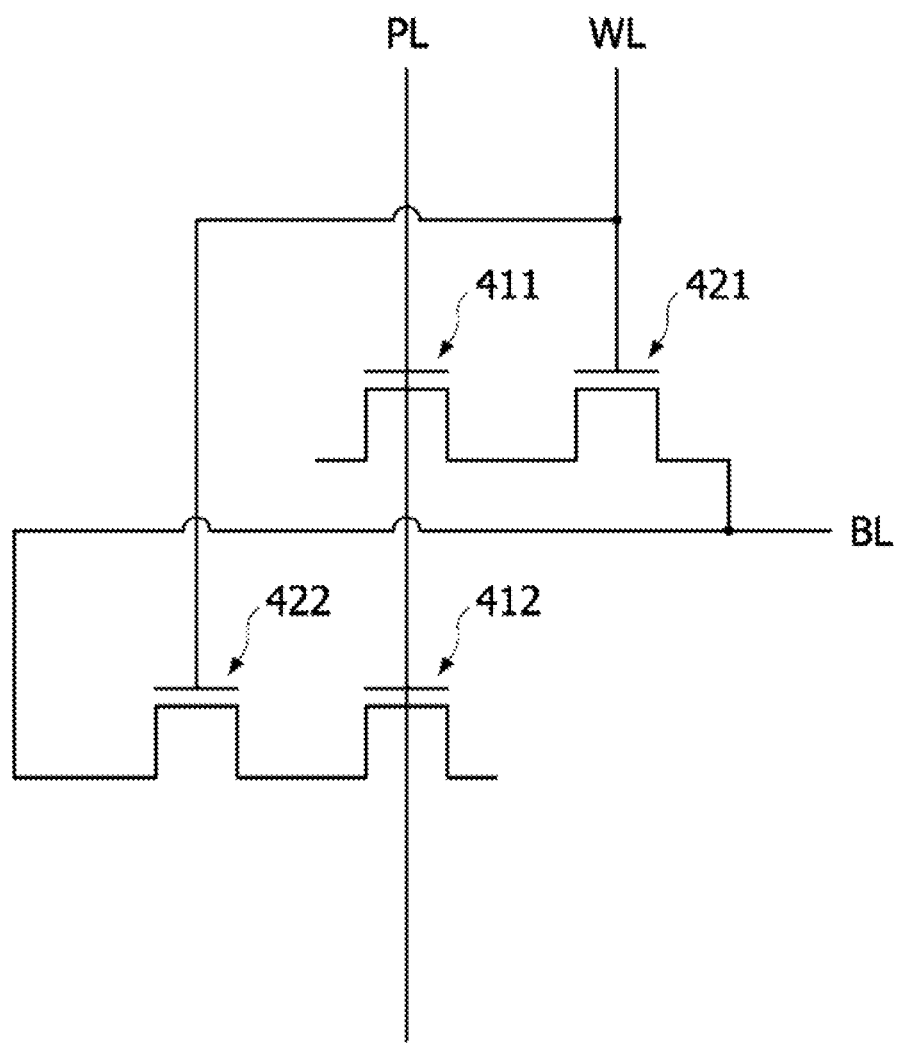
FIG. 13 is still another equivalent circuit diagram of the anti-fuse type OTP memory cell shown in FIG. 1.

FIG. 13 is still another equivalent circuit diagram of the anti-fuse type OTP memory cell shown in FIG. 1. Referring to FIG. 13, the equivalent circuit diagram of the anti-fuse type OTP memory cell according to the present embodiment may be similar to the equivalent circuit diagram of the anti-fuse type OTP memory cell illustrated in FIG. 7. Thus, further descriptions of the configurations described with reference to FIG. 7 will be omitted or briefly mentioned to avoid duplicate explanations. According to the present embodiment, the first selection transistor 421 may share a single word line WL and a single bit line BL with the second selection transistor 422. In the present embodiment, the first and second anti-fuse transistors 411 and 412 may be simultaneously programmed. Moreover, data of the first and second anti-fuse transistors 411 and 412 may be simultaneously read out. That is, one of the first and second anti-fuse transistors 411 and 412 may act as a redundancy cell.

Figure 14:
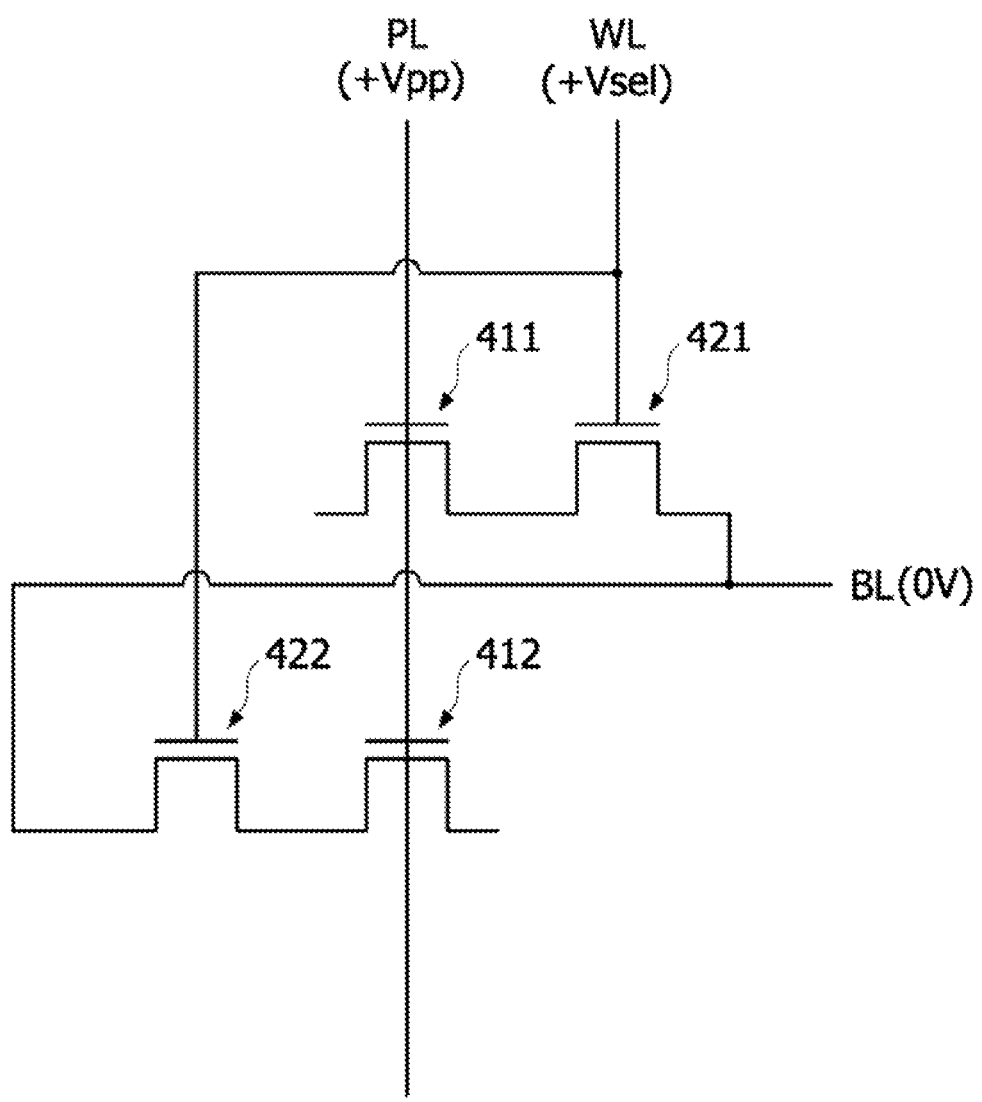
FIG. 14 is a circuit diagram illustrating a program operation of the anti-fuse type OTP memory cell shown in FIG. 13.

FIG. 14 is a circuit diagram illustrating a program operation of the anti-fuse type OTP memory cell shown in FIG. 13. Referring to FIGS. 5, 6, 13 and 14, a positive program voltage +Vpp may be applied to the program line PL to program the first anti-fuse transistor 411. For example, the positive program voltage +Vpp may be set to be about 6 volts. Moreover, a positive selection voltage +Vsel may be applied to the word line WL connected to the first selection gate 120 of the first selection transistor 421, and a ground voltage may be applied to the bit line BL which is connected to the first selection transistor 421. The positive selection voltage +Vsel may be set to have a voltage level which is capable of turning on the first selection transistor 421. For example, the positive selection voltage +Vsel may be set to be about 3 volts.

Under the above bias conditions, the first selection transistor 421 may be turned on. If the first selection transistor 421 is turned on, the first anti-fuse insulation layer 322a may be ruptured by a voltage difference between the positive program voltage +Vpp, applied to the program line PL, and the ground voltage, applied to the bit line BL. In this case, conductive filaments may be formed in the first anti-fuse insulation layer 322a to allow a program current to flow from the program gate (320 of FIG. 5) into the second impurity diffusion region (136 of FIG. 5) through the ruptured first anti-fuse insulation layer 322a of the first anti-fuse transistor 411. That is, the first anti-fuse transistor 411 may be programmed to electrically connect the program line PL to the second impurity diffusion region 136. During the program operation of the first anti-fuse transistor 411, the first selection transistor 421 may supply sufficient current to the second impurity diffusion region 136 and the first anti-fuse insulation layer 322a because the second width W12, corresponding to a channel width of the first selection transistor 421, is greater than the first width W11, corresponding to a channel width of the first anti-fuse transistor 411. As a result, program efficiency of the anti-fuse type OTP memory cell illustrated in FIG. 13 may be improved compared with an anti-fuse type OTP memory cell including a first selection transistor and a first anti-fuse transistor having the same channel width.

As illustrated in FIGS. 13 and 14, the first anti-fuse transistor 411 may share the program line PL with the second anti-fuse transistor 412, and the first selection transistor 421 may share the single word line WL and the bit line BL with the second selection transistor 422. Thus, the second anti-fuse transistor 412 may also be programmed while the first anti-fuse transistor 412 is programmed. That is, the second anti-fuse transistor 412 may act as a redundancy transistor of the first anti-fuse transistor 411.

Figure 15:
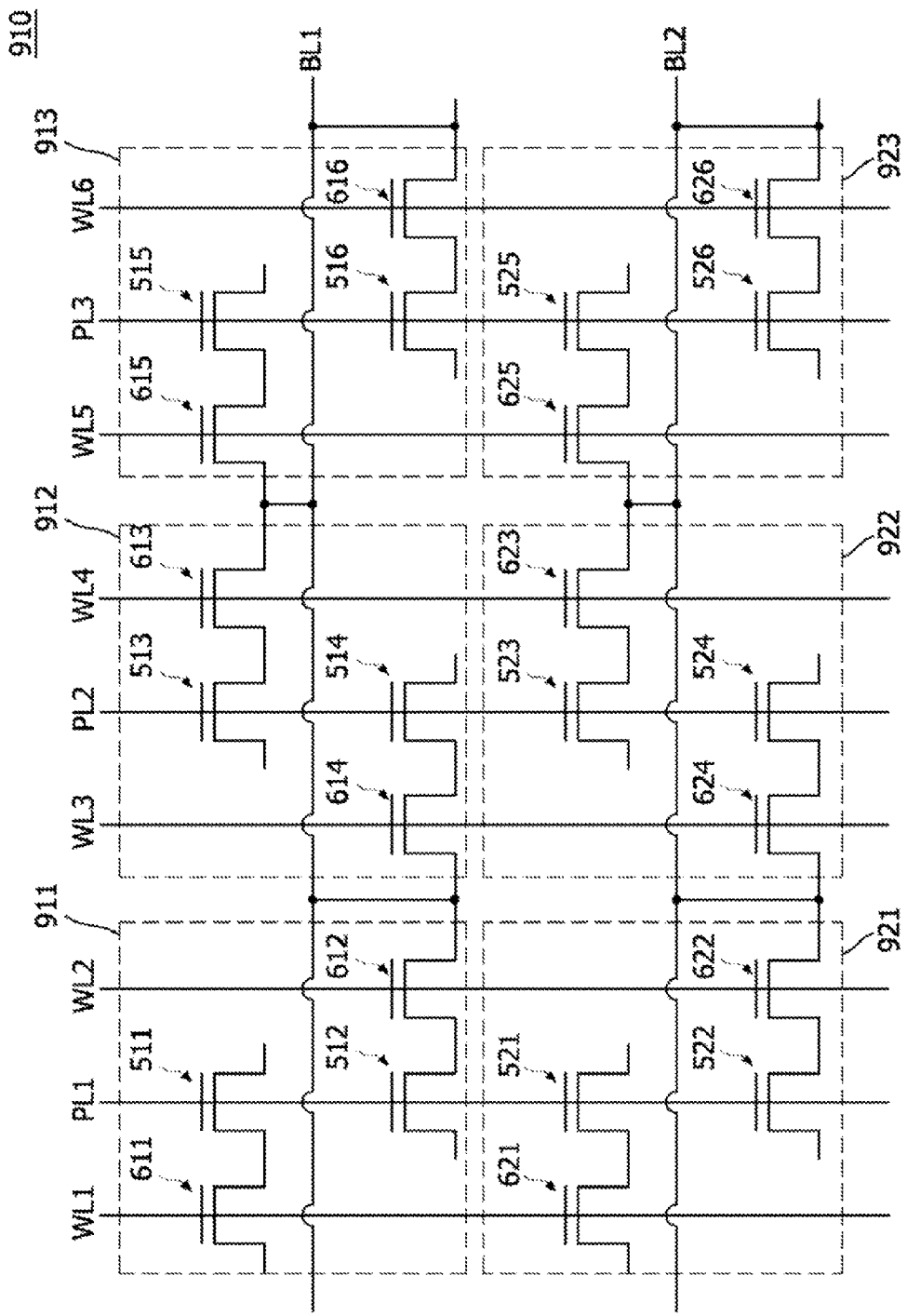
FIG. 15 is an equivalent circuit diagram illustrating an anti-fuse type OTP memory cell array according to an embodiment.

FIG. 15 is an equivalent circuit diagram illustrating an anti-fuse type OTP memory cell array 910 according to an embodiment. Referring to FIG. 15, the anti-fuse type OTP memory cell array 910 may include a plurality of program lines, for example, first, second and third program lines PL1, PL2 and PL3 which are disposed to extend in a direction (i.e., a vertical direction in FIG. 15) that is parallel with a plurality of word lines. The word lines may include a first group of word lines WL1, WL4 and WL5 and a second group of word lines WL2, WL3 and WL6. Each of the first group of word lines WL1, WL4 and WL5 may be disposed at a first side of any one among the first, second and third program lines PL1, PL2 and PL3 to be parallel with the corresponding program line. Similarly, each of the second group of word lines WL2, WL3 and WL6 may be disposed at a second side of any one among the first, second and third program lines PL1, PL2 and PL3 to be parallel with the corresponding program line. A plurality of bit lines, for example, first and second bit lines BL1 and BL2 may be disposed to intersect the word lines WL1 to WL6 and the program lines PL1 to PL3. A plurality of anti-fuse type OTP memory cells, for example, first to sixth anti-fuse type OTP memory cells 911, 912, 913, 921, 922 and 923 may be located at cross points of the program lines PL1, PL2 and PL3 and the bit lines BL1 and BL2, respectively. If the first, second and third program lines PL1, PL2 and PL3 are respectively disposed in first, second and third columns and the first and second bit lines BL1 and BL2 are respectively disposed in first and second rows, the first to sixth anti-fuse type OTP memory cells 911, 912, 913, 921, 922 and 923 may be respectively disposed at cross points of the first, second and third columns and the first and second rows.

The first anti-fuse type OTP memory cell 911, located at a cross point of the first program line PL1 (i.e., a first column) and the first bit line BL1 (i.e., a first row) may include a first anti-fuse transistor 511, a second anti-fuse transistor 512, a first selection transistor 611 and a second selection transistor 612. The second anti-fuse type OTP memory cell 912, located at a cross point of the second program line PL2 (i.e., a second column) and the first bit line BL1 (i.e., a first row), may include a first anti-fuse transistor 513, a second anti-fuse transistor 514, a first selection transistor 613 and a second selection transistor 614. The third anti-fuse type OTP memory cell 913, located at a cross point of the third program line PL3 (i.e., a third column) and the first bit line BL1 (i.e., a first row), may include a first anti-fuse transistor 515, a second anti-fuse transistor 516, a first selection transistor 615 and a second selection transistor 616.

The fourth anti-fuse type OTP memory cell 921, located at a cross point of the first program line PL1 (i.e., a first column) and the second bit line BL2 (i.e., a second row) may include a first anti-fuse transistor 521, a second anti-fuse transistor 522, a first selection transistor 621 and a second selection transistor 622. The fifth anti-fuse type OTP memory cell 922, located at a cross point of the second program line PL2 (i.e., a second column) and the second bit line BL2 (i.e., a second row), may include a first anti-fuse transistor 523, a second anti-fuse transistor 524, a first selection transistor 623 and a second selection transistor 624. The sixth anti-fuse type OTP memory cell 923, located at a cross point of the third program line PL3 (i.e., a third column) and the second bit line BL2 (i.e., a second row), may include a first anti-fuse transistor 525, a second anti-fuse transistor 526, a first selection transistor 625 and a second selection transistor 626. Each of the first to sixth anti-fuse type OTP memory cells 911, 912, 913, 921, 922 and 923 may have the same configuration as the anti-fuse type OTP memory cell described with reference to FIG. 10. Thus, descriptions of configurations of the first to sixth anti-fuse type OTP memory cells 911, 912, 913, 921, 922 and 923 will be omitted hereinafter to avoid duplicate explanations.

The first anti-fuse transistors and the second anti-fuse transistors included in the anti-fuse type OTP memory cells arrayed in each column may share any one of the first, second and third program lines PL1, PL2 and PL3 with each other. For example, the first anti-fuse transistors 511 and 521 and the second anti-fuse transistors 512 and 522, included in the anti-fuse type OTP memory cells 911 and 921 arrayed in the first column, may share the first program line PL1 with each other, the first anti-fuse transistors 513 and 523 and the second anti-fuse transistors 514 and 524, included in the anti-fuse type OTP memory cells 912 and 922 arrayed in the second column, may share the second program line PL2 with each other, and the first anti-fuse transistors 515 and 525 and the second anti-fuse transistors 516 and 526, included in the anti-fuse type OTP memory cells 913 and 923 arrayed in the third column, may share the third program line PL3 with each other.

The first anti-fuse transistors and the second anti-fuse transistors of the anti-fuse type OTP memory cells arrayed in each row may be disposed at both sides of any one of the first and second bit lines BL1 and BL2, respectively. For example, the first anti-fuse transistors 511, 513 and 515 of the anti-fuse type OTP memory cells 911, 912 and 913 arrayed in the first row may be disposed at one side of the first bit line BL1, and the second anti-fuse transistors 512, 514 and 516 of the anti-fuse type OTP memory cells 911, 912 and 913 arrayed in the first row may be disposed at the other side of the first bit line BL1. Similarly, the first anti-fuse transistors 521, 523 and 525 of the anti-fuse type OTP memory cells 921, 922 and 923 arrayed in the second row may be disposed at one side of the second bit line BL2, and the second anti-fuse transistors 522, 524 and 526 of the anti-fuse type OTP memory cells 921, 922 and 923 arrayed in the second row may be disposed at the other side of the second bit line BL2.

The first selection transistors of the anti-fuse type OTP memory cells arrayed in each column may share any one word line of the first to sixth word lines WL1 to WL6, and the second selection transistors of the anti-fuse type OTP memory cells arrayed in each column may share another word line of the first to sixth word lines WL1 to WL6. For example, the first selection transistors 611 and 621 of the anti-fuse type OTP memory cells 911 and 921 arrayed in the first column may share the first word line WL1, and the second selection transistors 612 and 622 of the anti-fuse type OTP memory cells 911 and 921 arrayed in the first column may share the second word line WL2. Similarly, the first selection transistors 613 and 623 of the anti-fuse type OTP memory cells 912 and 922 arrayed in the second column may share the fourth word line WL4, and the second selection transistors 614 and 624 of the anti-fuse type OTP memory cells 912 and 922 arrayed in the second column may share the third word line WL3. In addition, the first selection transistors 615 and 625 of the anti-fuse type OTP memory cells 913 and 923 arrayed in the third column may share the fifth word line WL5, and the second selection transistors 616 and 626 of the anti-fuse type OTP memory cells 913 and 923 arrayed in the third column may share the sixth word line WL6. In each of the anti-fuse type OTP memory cells 911, 912, 913, 921, 922 and 923, the first selection transistor 611, 613, 615, 621, 623 or 625 may be connected in series to the first anti-fuse transistor 511, 513, 515, 521, 523 or 525, and the second selection transistor 612, 614, 616, 622, 624 or 626 may be connected in series to the second anti-fuse transistor 512, 514, 516, 522, 524 or 526.

In the present embodiment, the anti-fuse type OTP memory cells in each row may be repeatedly arrayed to be symmetric with respect to imaginary lines therebetween. Thus, the couple of first selection transistors (or the couple of second selection transistors) included in the couple of adjacent anti-fuse type OTP memory cells disposed in each row may be connected in series and may be connected to one of the first and second bit lines BL1 and BL2. For example, the first selection transistors 613 and 615 included in the second and third anti-fuse type OTP memory cells 912 and 913 disposed in the first row may be connected in series and may be connected to the first bit line BL1 to share the first bit line BL1. Similarly, the first selection transistors 623 and 625 included in the fifth and sixth anti-fuse type OTP memory cells 922 and 923 disposed in the second row may also be connected in series and may be connected to the second bit line BL2 to share the second bit line BL2. In addition, the second selection transistors 612 and 614 included in the first and second anti-fuse type OTP memory cells 911 and 912 disposed in the first row may be connected in series and may be connected to the first bit line BL1 to share the first bit line BL1. Similarly, the second selection transistors 622 and 624 included in the fourth and fifth anti-fuse type OTP memory cells 921 and 922 disposed in the second row may be connected in series and may be connected to the second bit line BL2 to share the second bit line BL2.

Figure 16:
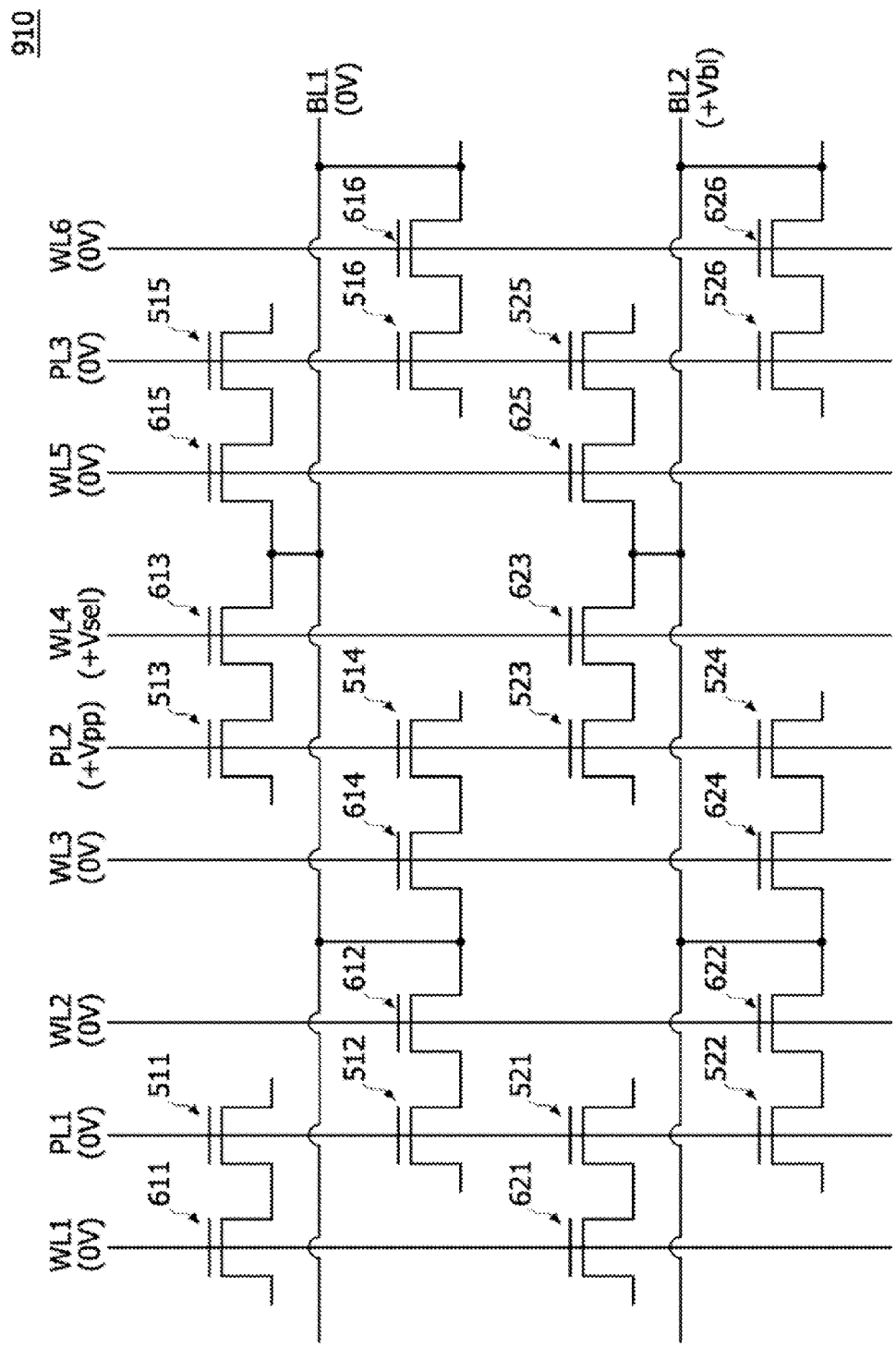
FIG. 16 is a circuit diagram illustrating a program operation of the anti-fuse type OTP memory cell array shown in FIG. 15.

FIG. 16 is a circuit diagram illustrating a program operation of the anti-fuse type OTP memory cell array 910 shown in FIG. 15. Although FIG. 16 illustrates an example in which the first anti-fuse transistor 513 is programmed, the inventive concept is not limited thereto. That is, the program operation illustrated in FIG. 16 may be equally applicable to other anti-fuse transistors. Referring to FIG. 16, in order to selectively program the first anti-fuse transistor 513, a positive program voltage +Vpp may be applied to the second program line PL2 connected to the first anti-fuse transistor 513 and a ground voltage may be applied to the remaining program lines PL1 and PL3. In addition, a positive selection voltage +Vsel may be applied to the fourth word line WL4 connected to the first selection transistor 613 which is connected in series to the first anti-fuse transistor 513, and a ground voltage may be applied to the first bit line BL1 connected to the first selection transistor 613. Further, the remaining word lines WL1 to WL3, WL5 and WL6 may be grounded, and a positive bit line voltage +Vbl may be applied to the remaining bit line BL2. For example, the positive program voltage +Vpp may be about 6 volts, and the positive selection voltage +Vsel may be about 3 volts. Moreover, the positive bit line voltage +Vbl may be about 3 volts.

Under the above bias condition, the first anti-fuse transistor 513 may be selectively programmed by the same mechanism as described with reference to FIG. 8. In such a case, the second anti-fuse transistor 514, sharing the second program line PL2 and the first bit line BL1 with the selected first anti-fuse transistor 513, is not programmed as described with reference to FIG. 8. The first anti-fuse transistor 523, sharing the second program line PL2 with the selected first anti-fuse transistor 513, may also be non-programmed. This is because the voltage difference between the positive program voltage +Vpp applied to the second program line PL2 and the positive bit line voltage +Vbl applied to the second bit line BL2 is lower than the critical voltage, which is capable of rupturing the anti-fuse insulation layer of the first anti-fuse transistor 523. The second anti-fuse transistor 524, sharing the second program line PL2 with the selected first anti-fuse transistor 513, may also be non-programmed because the second selection transistor 624 is turned off. Other anti-fuse transistors 511, 512, 515, 516, 521, 522, 525 and 526 may also be non-programmed because the program lines PL1 and PL3 connected to the anti-fuse transistors 511, 512, 515, 516, 521, 522, 525 and 526 are grounded.

Figure 17:
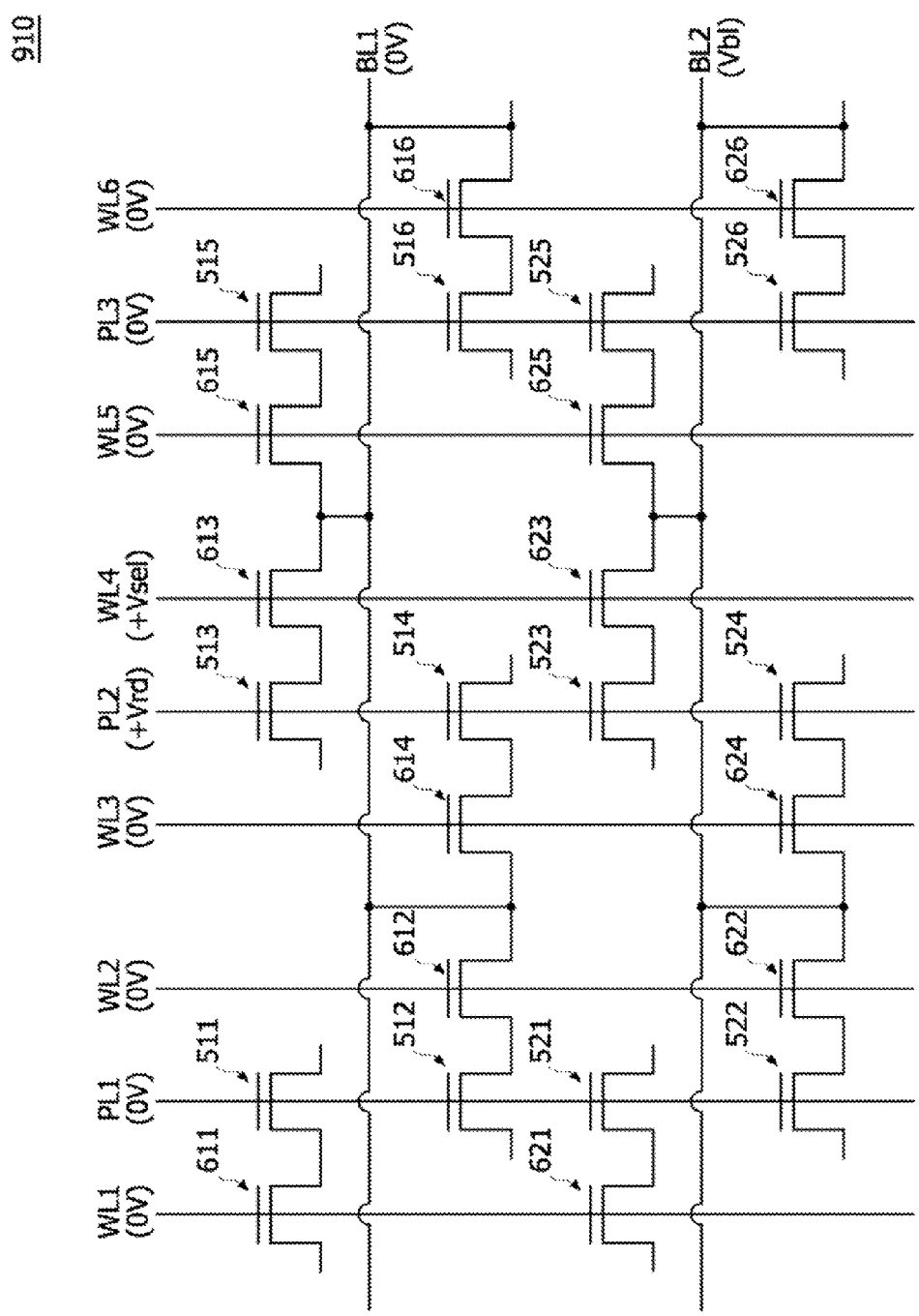
FIG. 17 is a circuit diagram illustrating a read operation of the anti-fuse type OTP memory cell array shown in FIG. 15.

FIG. 17 is a circuit diagram illustrating a read operation of the anti-fuse type OTP memory cell array 910 shown in FIG. 15. Although FIG. 17 illustrates an example in which a datum of the first anti-fuse transistor 513 is read out, the inventive concept is not limited thereto. That is, the read operation illustrated in FIG. 17 may be equally applicable to other anti-fuse transistors. Referring to FIG. 17, in order to selectively read out a datum of the first anti-fuse transistor 513, a positive read voltage +Vrd may be applied to the second program line PL2 connected to the first anti-fuse transistor 513 and a ground voltage may be applied to the remaining program lines PL1 and PL3. In addition, a positive selection voltage +Vsel may be applied to the fourth word line WL4 connected to the first selection transistor 613 which is connected in series to the first anti-fuse transistor 513, and a ground voltage may be applied to the first bit line BL1 connected to the first selection transistor 613. Further, the remaining word lines WL1 to WL3, WL5 and WL6 may be grounded, and a positive bit line voltage +Vbl may be applied to the remaining bit line BL2. For example, the positive read voltage +Vrd may be about 2 volts, and the positive selection voltage +Vsel may be about 1.2 volts. Moreover, the positive bit line voltage +Vbl may have the same voltage level as the positive read voltage +Vrd. That is, the positive bit line voltage +Vbl may be about 2 volts.

Under the above bias condition, the first selection transistor 613 may be turned on, and a read current may flow from the second program line PL2 into the first bit line BL1 through conductive filaments in the anti-fuse insulation layer of the first anti-fuse transistor 513, if the first anti-fuse transistor 513 has a programmed state. If the first anti-fuse transistor 513 has a non-programmed state, no current flows between the second program line PL2 and the first bit line BL1 under the above bias condition. During the read operation, data of the anti-fuse transistors 514, 523 and 524 sharing the second program line PL2 with the selected first anti-fuse transistor 513 are not read out. Specifically, the datum of the anti-fuse transistor 514 may not be read out through the first bit line BL1 because the second selection transistor 614 is turned off during the read operation. In addition, the datum of the anti-fuse transistor 523 may not be read out through the second bit line 2 because there is no voltage difference between the second program line PL2 and the second bit line BL2 during the read operation. Moreover, the datum of the anti-fuse transistor 524 may not be read out through the second bit line 2 because the second selection transistor 624 is turned off during the read operation.

Figure 18:
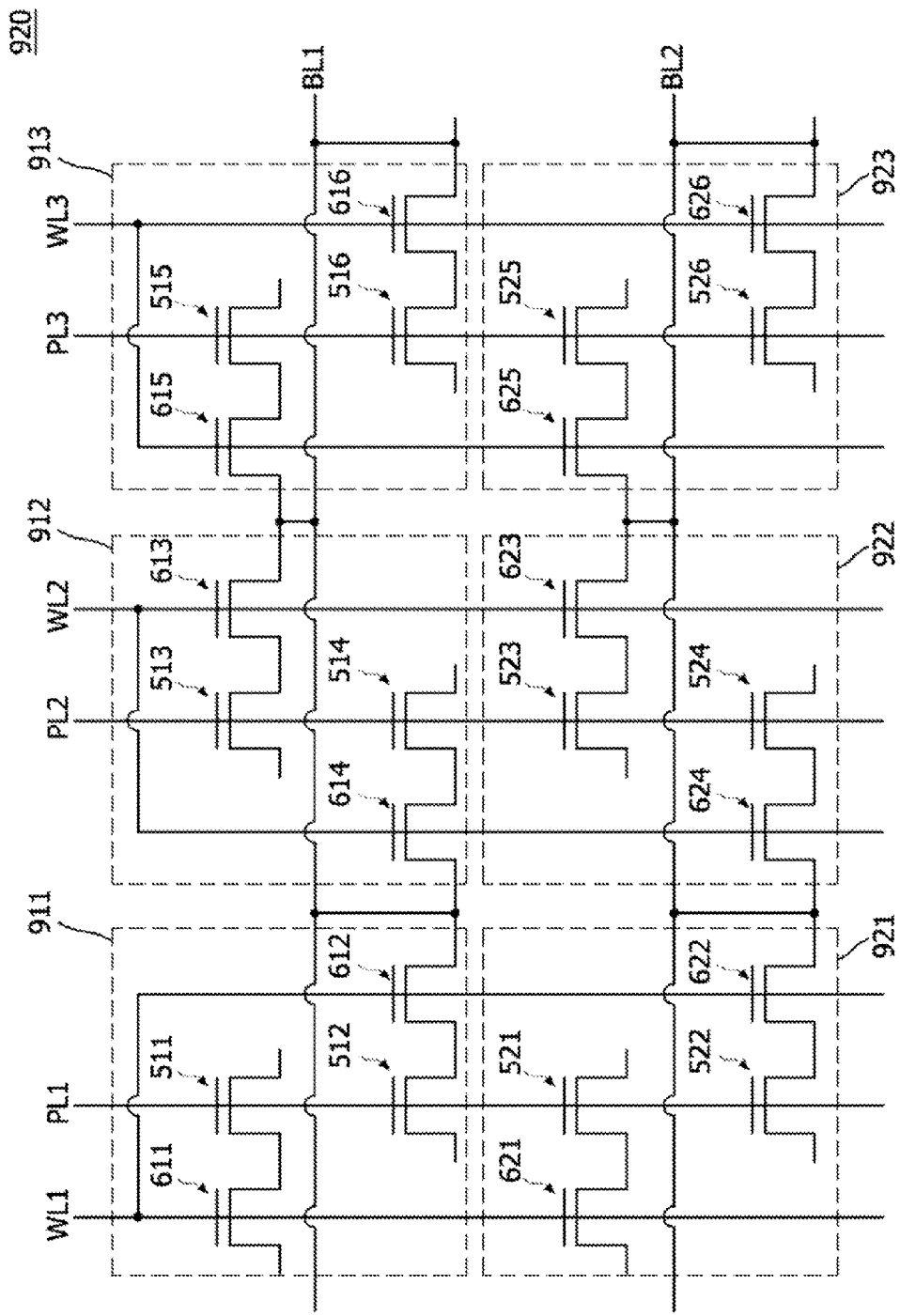
FIG. 18 is an equivalent circuit diagram illustrating an anti-fuse type OTP memory cell array according to another embodiment.

FIG. 18 is an equivalent circuit diagram illustrating an anti-fuse type OTP memory cell array 920 according to another embodiment. Referring to FIG. 18, the anti-fuse type OTP memory cell array 920 according to the present embodiment may be similar to the anti-fuse type OTP memory cell array 910 illustrated in FIG. 15. Thus, descriptions of the same configurations as described with reference to FIG. 15 will be omitted or briefly mentioned in the present embodiment to avoid duplicate explanations. According to the present embodiment, all of the first and second selection transistors of the anti-fuse type OTP memory cells arrayed in each column may share a single word line with each other. That is, the first and second selection transistors 611, 612, 621 and 622 of the anti-fuse type OTP memory cells 911 and 921 arrayed in the first column may be connected to a single word line, for example, a first word line WL1, and the first and second selection transistors 613, 614, 623 and 624 of the anti-fuse type OTP memory cells 912 and 922 arrayed in the second column may be connected to a single word line, for example, a second word line WL2. In addition, the first and second selection transistors 615, 616, 625 and 626 of the anti-fuse type OTP memory cells 913 and 923 arrayed in the third column may also be connected to a single word line, for example, a third word line WL3. Thus, in each of the anti-fuse type OTP memory cells 911, 912, 913, 921, 922 and 923, any one of the first and second anti-fuse transistors may act as a redundancy transistor, as described with reference to FIG. 13.

Figure 19:
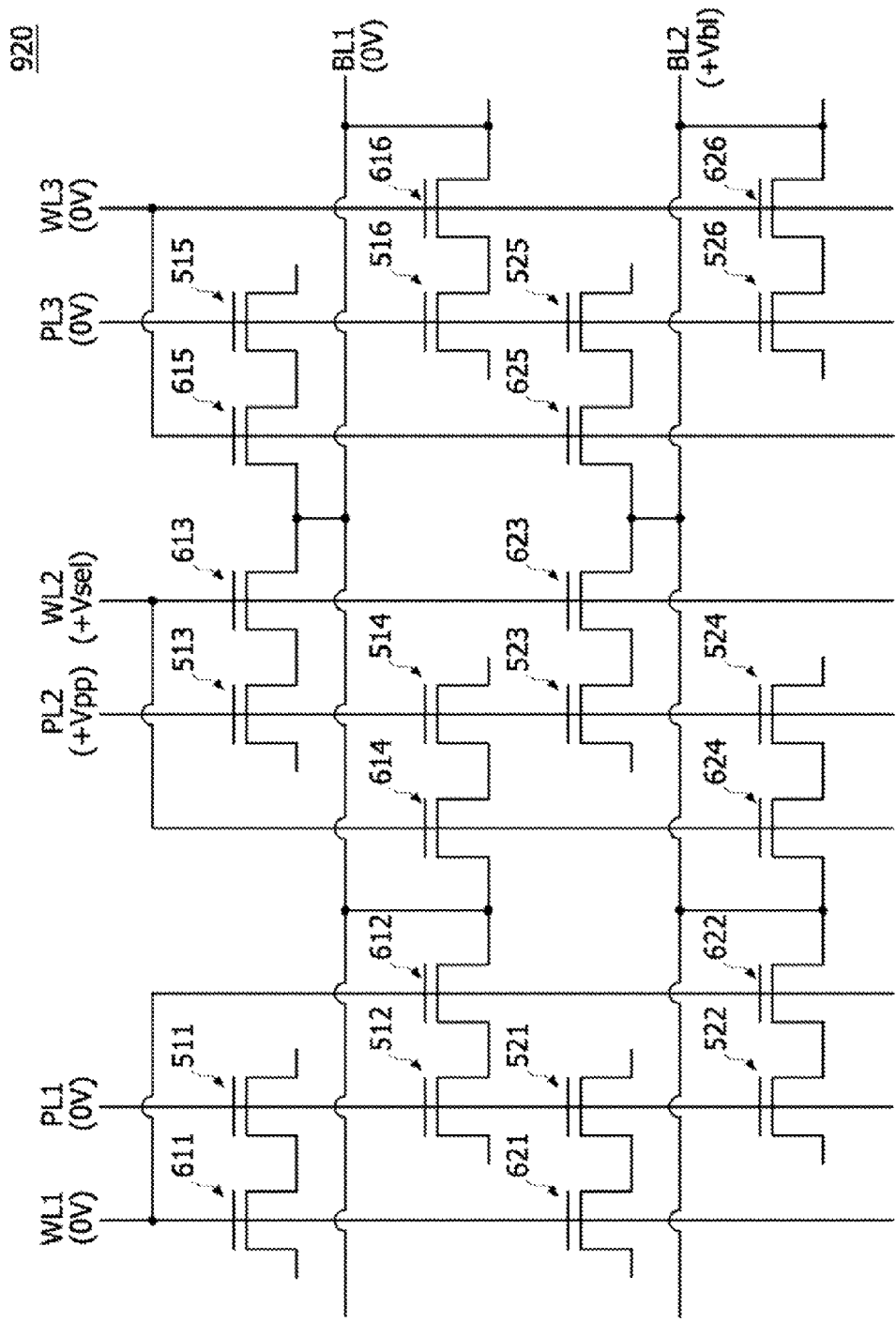
FIG. 19 is a circuit diagram illustrating a program operation of the anti-fuse type OTP memory cell array shown in FIG. 18.

FIG. 19 is a circuit diagram illustrating a program operation of the anti-fuse type OTP memory cell array 920 shown in FIG. 18. Although FIG. 19 illustrates an example in which the first anti-fuse transistor 513 and the second anti-fuse transistor 514 acting as a redundancy transistor are simultaneously programmed, the inventive concept is not limited thereto. That is, the program operation illustrated in FIG. 19 may be equally applicable to other anti-fuse transistors and redundancy transistors thereof. Referring to FIG. 19, in order to selectively program the first and second anti-fuse transistors 513 and 514, a positive program voltage +Vpp may be applied to the second program line PL2 connected to the first and second anti-fuse transistors 513 and 514 and a ground voltage may be applied to the remaining program lines PL1 and PL3. In addition, a positive selection voltage +Vsel may be applied to the second word line WL2 connected to the first and second selection transistors 613 and 614, which are respectively connected in series to the first and second anti-fuse transistors 513 and 514, and a ground voltage may be applied to the first bit line BL1 connected to the first and second selection transistors 613 and 614. Further, the remaining word lines WL1 and WL3 may be grounded, and a positive bit line voltage +Vbl may be applied to the remaining bit line BL2. For example, the positive program voltage +Vpp may be about 6 volts, and the positive selection voltage +Vsel may be about 3 volts. Moreover, the positive bit line voltage +Vbl may be about 3 volts.

Under the above bias conditions, the first and second anti-fuse transistors 513 and 514 may be selectively programmed by the same mechanism as described with reference to FIG. 14. In such a case, the first anti-fuse transistors 511 and 515 and the second anti-fuse transistors 512 and 516, sharing the first bit line BL1 with the selected first and second anti-fuse transistors 513 and 514, are not programmed because the first and third program lines PL1 and PL3 are grounded. In addition, the first and second anti-fuse transistors 523 and 524, sharing the second program line PL2 with the selected first and second anti-fuse transistors 513 and 514, are not programmed. This is because the voltage difference between the positive program voltage +Vpp, applied to the second program line PL,2 and the positive bit line voltage +Vbl, applied to the second bit line BL2, is lower than the critical voltage, which is capable of rupturing the anti-fuse insulation layers of the first and second anti-fuse transistors 523 and 524.

Figure 20:
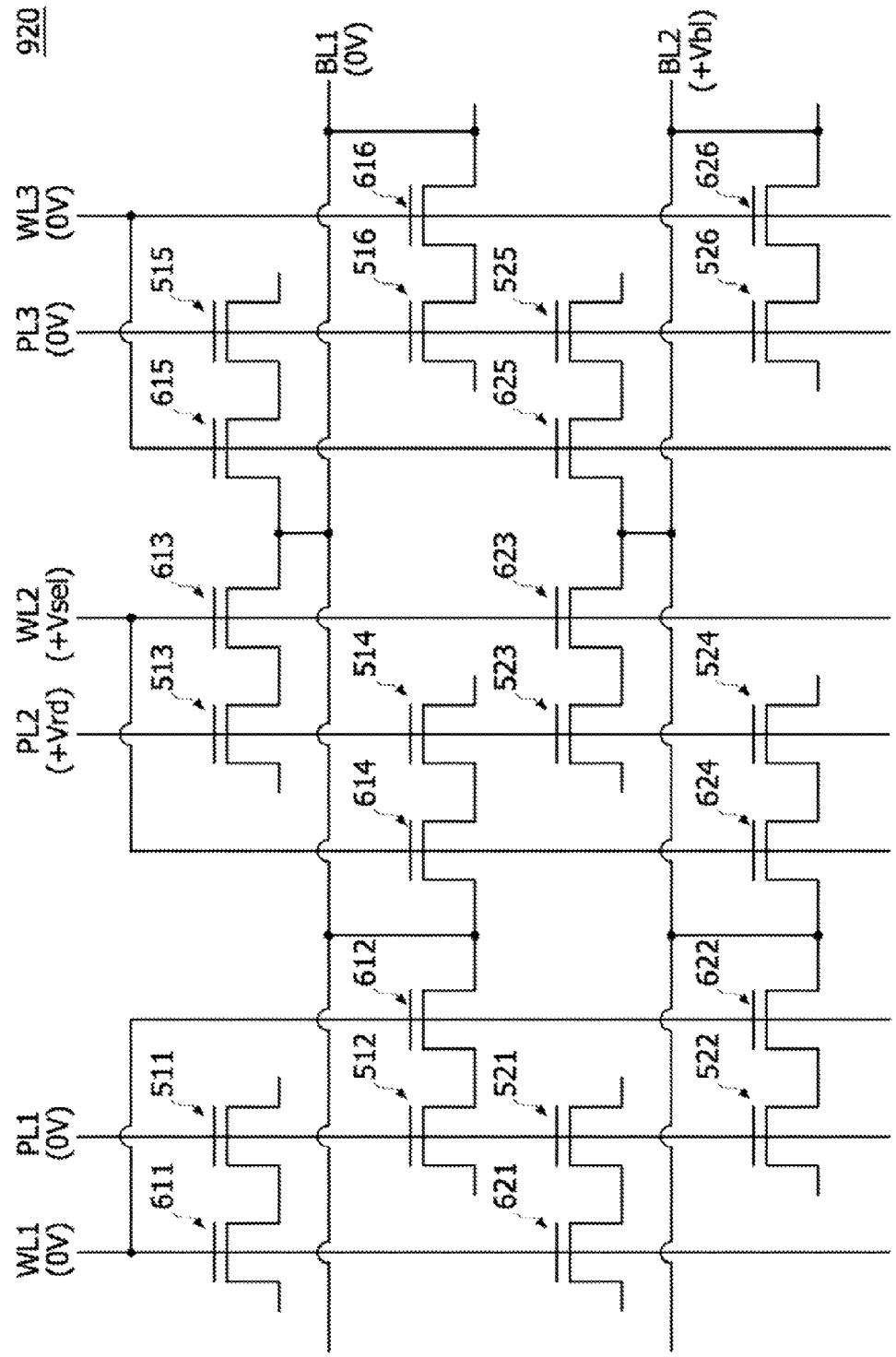
FIG. 20 is a circuit diagram illustrating a read operation of the anti-fuse type OTP memory cell array shown in FIG. 18.

FIG. 20 is a circuit diagram illustrating a read operation of the anti-fuse type OTP memory cell array 920 shown in FIG. 18. Although FIG. 20 illustrates an example in which data of the first anti-fuse transistor 513 and the second anti-fuse transistor 514 (acting as a redundancy transistor) are read out, the inventive concept is not limited thereto. That is, the read operation illustrated in FIG. 20 may be equally applicable to other anti-fuse transistors. Referring to FIG. 20, in order to selectively read out the data of the first and second anti-fuse transistors 513 and 514, a positive read voltage +Vrd may be applied to the second program line PL2 connected to the first and second anti-fuse transistors 513 and 514 and a ground voltage may be applied to the remaining program lines PL1 and PL3. In addition, a positive selection voltage +Vsel may be applied to the second word line WL2, connected to the first and second selection transistors 613 and 614 which are respectively connected in series to the first and second anti-fuse transistors 513 and 514, and a ground voltage may be applied to the first bit line BL1 connected to the first and second selection transistors 613 and 614. Further, the remaining word lines WL1 and WL3 may be grounded, and a positive bit line voltage +Vbl may be applied to the remaining bit line BL2. For example, the positive read voltage +Vrd may be about 2 volts, and the positive selection voltage +Vsel may be about 1.2 volts. Moreover, the positive bit line voltage +Vbl may have the same voltage level as the positive read voltage +Vrd. That is, the positive bit line voltage +Vbl may be about 2 volts.

Under the above bias conditions, the first and second selection transistors 613 and 614 may be turned on, and a read current may flow from the second program line PL2 into the first bit line BL1 through conductive filaments in the anti-fuse insulation layers of the first and second anti-fuse transistors 513 and 514 if the selected first and second anti-fuse transistors 513 and 514 have programmed states. If the first and second anti-fuse transistors 513 and 514 are in the non-programmed state, no current flows between the second program line PL2 and the first bit line BL1 under the above bias conditions. During the read operation, data of the first and second anti-fuse transistors 523 and 524 are not read out. Specifically, the data of the first and second anti-fuse transistors 523 and 524, sharing the second program line PL2 with the selected first and second anti-fuse transistors 513 and 514, may not be read out through the first bit line BL1 because there is no voltage difference between the second program line PL2 and the second bit line BL2 during the read operation. Moreover, the data of the first anti-fuse transistors 511 and 515 and the second anti-fuse transistors 512 and 516, sharing the first bit line BL1 with the selected first and second anti-fuse transistors 513 and 514, may not be read out through the first bit line BL1 because the non-selected program lines PL1 and PL3 are grounded or the first and second selection transistors 611, 615, 612 and 616 are turned off during the read operation.

Figure 21:
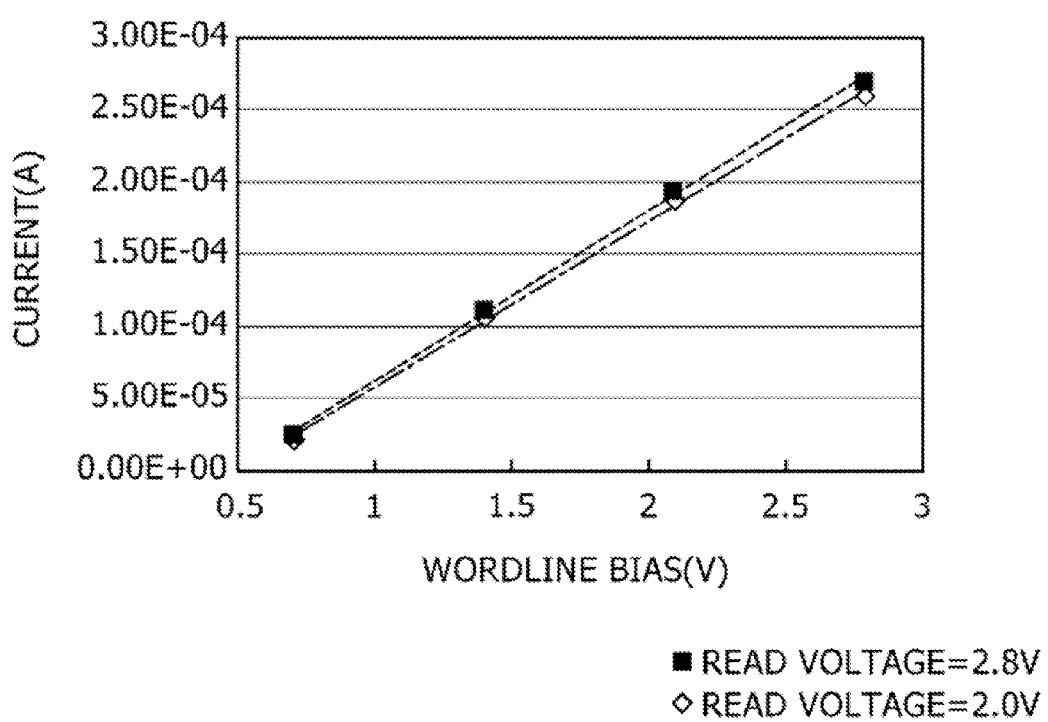
FIG. 21 is a graph illustrating current versus word line bias characteristics of selection transistors employed in the anti-fuse type OTP memory cell arrays according to the embodiments.

FIG. 21 is a graph illustrating current versus word line bias characteristics of the selection transistors employed in the anti-fuse type OTP memory cell arrays according to the embodiments. In FIG. 21, the abscissa represents a voltage applied to a word line connected to a gate of the selection transistor and the ordinate represents a drain current of the selection transistor. As illustrated in FIG. 21, as a bias voltage applied to the word lines acting as gate electrodes of the selection transistors increases, drain currents flowing through the selection transistors also increase. This means that the program efficiency of the anti-fuse type OTP memory cells is improved if the word line bias increases. According to the embodiments, the selection transistors may be designed to have a channel width which is greater than a channel width of the anti-fuse transistors. In such a case, the drain current of the selection transistors may increase even without increasing the word line bias, thereby improving program efficiency of the anti-fuse type OTP memory cells. In other words, the selection transistors employed in the anti-fuse type OTP memory cells according to the embodiments may exhibit the same drain current as selection transistors of the general anti-fuse type OTP memory cells even though the word line bias is lowered. In such a case, the area that an internal circuit for generating the word line bias occupies may be reduced to increase the integration density of peripheral circuits of anti-fuse type OTP memory devices.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. An anti-fuse type one-time programmable (OTP) memory cell comprising:
   a first active region having a first program region with a first width and a first selection region with a second width that is greater than the first width;
   a second active region spaced apart from the first active region and having a second program region with a third width and a second selection region with a fourth width that is greater than the third width;
   a program gate intersecting the first program region and the second program region;
   a first selection gate intersecting the first selection region; and
   a second selection gate intersecting the second selection region.

2. The memory cell of claim 1, wherein the second width is at least twice that of the first width, and the fourth width is at least twice that of the third width.

3. The memory cell of claim 1, wherein the first width is substantially equal to the third width, and the second width is substantially equal to the fourth width.

4. The memory cell of claim 1, wherein the first active region and the second active region are symmetric with respect to a point located between the first and second active regions.

5. The memory cell of claim 1, further comprising:
   a first impurity diffusion region in the first active region, adjacent to a side of the first selection gate opposite to the program gate;
   a second impurity diffusion region in the first active region, adjacent to another side of the first selection gate opposite to the first impurity diffusion region;
   a third impurity diffusion region in the first active region, adjacent to a side of the second selection gate opposite to the program gate;
   a fourth impurity diffusion region in the first active region, adjacent to another side of the second selection gate opposite to the third impurity diffusion region.

6. The memory cell of claim 5, wherein each of the first, second, third and fourth impurity diffusion regions has N-type conductivity.

7. The memory cell of claim 1,
   wherein a portion of the first program region, overlapping with the program gate, corresponds to a first channel region;
   wherein a portion of the second program region, overlapping with the program gate, corresponds to a second channel region;
   wherein a portion of the first selection region, overlapping with the first selection gate, corresponds to a third channel region; and
   wherein a portion of the second selection region, overlapping with the second selection gate, corresponds to a fourth channel region.

8. The memory cell of claim 7,
   wherein the first channel region has a channel width that is substantially equal to the first width;
   wherein the second channel region has a channel width that is substantially equal to the third width;
   wherein the third channel region has a channel width that is substantially equal to the second width; and
   wherein the fourth channel region has a channel width that is substantially equal to the fourth width.

9. The memory cell of claim 1, further comprising:
   a first gate insulation layer between the program gate and the first and second program regions;
   a second gate insulation layer between the first selection gate and the first selection region; and
   a third gate insulation layer between the second selection gate and the second selection region.

10. An anti-fuse type one-time programmable (OTP) memory cell comprising:
    a first anti-fuse transistor;
    a second anti-fuse transistor sharing a program line with the first anti-fuse transistor;
    a first selection transistor connected in series to the first anti-fuse transistor and connected to a first word line and a first bit line; and
    a second selection transistor connected in series to the second anti-fuse transistor and connected to a second word line and a second bit line.

11. The memory cell of claim 10, wherein a channel width of the first selection transistor is greater than a channel width of the first anti-fuse transistor, and a channel width of the second selection transistor is greater than a channel width of the second anti-fuse transistor.

12. The memory cell of claim 10, wherein a channel width of the first anti-fuse transistor is substantially equal to a channel width of the second anti-fuse transistor, and a channel width of the first selection transistor is substantially equal to a channel width of the second selection transistor.

13. The memory cell of claim 10, wherein the first and second bit lines are electrically connected to each other.

14. The memory cell of claim 10, wherein the first and second word lines are electrically connected to each other.

15. An anti-fuse type one-time programmable (OTP) memory cell array comprising:
    a plurality of parallel program lines disposed in a plurality of columns, respectively;
    a plurality of word lines including a first word line and a second word line that are respectively disposed at both sides of each of the program lines;
    a plurality of bit lines disposed in a plurality of rows to intersect the program lines and the word lines, respectively;
    a plurality of anti-fuse transistors disposed in each column to include first anti-fuse transistors and second anti-fuse transistors, which are connected to any one of the program lines, the first anti-fuse transistors being respectively disposed at first sides of the bit lines and the second anti-fuse transistors being respectively disposed at second sides of the bit lines; and
    a plurality of selection transistors disposed in each column to include first selection transistors, respectively connected in series to the first anti-fuse transistors and second selection transistors, respectively connected in series to the second anti-fuse transistors, the first selection transistors in each column being connected to any one of the first word lines and the second selection transistors in each column being connected to any one of the second word lines,
    wherein the first and second selection transistors in each row are connected in common to any one of the bit lines.

16. The memory cell array of claim 15, wherein a channel width of the first selection transistors is greater than a channel width of the first anti-fuse transistors.

17. The memory cell array of claim 15, wherein a channel width of the second selection transistors is greater than a channel width of the second anti-fuse transistors, and a channel width of the first selection transistors is substantially equal to a channel width of the second selection transistors.

18. The memory cell array of claim 15, wherein the first word line and the second word line disposed in each of the columns are electrically connected to each other.

19. The memory cell array of claim 15,
wherein two adjacent transistors among the first selection transistors disposed in each row are connected in series and are electrically connected in common to any one of the bit lines; and
wherein two adjacent transistors among the second selection transistors disposed in each row are connected in series and are electrically connected in common to any one of the bit lines.

* * * * *